US011917846B2

(12) United States Patent
Heo et al.

(10) Patent No.: US 11,917,846 B2
(45) Date of Patent: Feb. 27, 2024

(54) DISPLAY DEVICE HAVING AN OXIDE INSULATING FILM BETWEEN SUBPIXELS AND METHOD FOR MANUFACTURING THE SAME

(71) Applicant: LG Display Co., Ltd., Seoul (KR)

(72) Inventors: JoonYoung Heo, Paju-si (KR); YongMin Park, Paju-si (KR); KyungHoon Lee, Paju-si (KR); YoungHoon Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/825,099

(22) Filed: May 26, 2022

(65) Prior Publication Data

US 2022/0302407 A1    Sep. 22, 2022

Related U.S. Application Data

(63) Continuation of application No. 17/028,571, filed on Sep. 22, 2020, now Pat. No. 11,469,390.

(30) Foreign Application Priority Data

Sep. 23, 2019   (KR) ......................... 10-2019-0116576

(51) Int. Cl.
*H10K 50/818*    (2023.01)
*H10K 50/125*    (2023.01)
(Continued)

(52) U.S. Cl.
CPC ......... *H10K 50/818* (2023.02); *H10K 50/125* (2023.02); *H10K 59/12* (2023.02); *H10K 71/00* (2023.02)

(58) Field of Classification Search
CPC .... H10K 50/818; H10K 50/125; H10K 59/12; H10K 71/00; H10K 2102/3026;
(Continued)

(56) References Cited

U.S. PATENT DOCUMENTS 8,378,361 B2   2/2013  Takeuchi et al.
8,569,774 B2  10/2013  Yuasa
(Continued)

FOREIGN PATENT DOCUMENTS

CN        1969595 A    5/2007
CN      102077689 A    5/2011
(Continued)

OTHER PUBLICATIONS

Intellectual Property Office of the United Kingdom, Office Action, GB Patent Application No. 2014985.2, dated Feb. 12, 2021, six pages.
(Continued)

*Primary Examiner* — Caleb E Henry
(74) *Attorney, Agent, or Firm* — Fenwick & West LLP

(57) ABSTRACT

A display device is disclosed, which may reduce an interval between subpixels and maximize a light emission area. The display device comprises a substrate provided with a first subpixel and a second subpixel arranged to adjoin the first subpixel, a first electrode provided in each of the first subpixel and the second subpixel on the substrate, including a first material, and an oxide insulating film provided to cover at least a portion of a side of the first electrode and made of a second material. The first material is a metal material, and the second material is an oxide of the first material.

12 Claims, 19 Drawing Sheets

(51) Int. Cl.
*H10K 59/12* (2023.01)
*H10K 71/00* (2023.01)

(58) Field of Classification Search
CPC ........ H10K 50/13; H10K 50/19; H10K 50/81; H10K 59/122; H10K 59/38; H10K 50/11; H10K 50/805; H10K 50/856; H10K 59/1201; H10K 2102/00; G02B 27/01; H05B 33/12

See application file for complete search history.

(56) References Cited

U.S. PATENT DOCUMENTS

| | | | |
|---|---|---|---|
| 8,866,160 B2 | 10/2014 | Nishiyama | |
| 8,981,352 B2 | 3/2015 | Yamada et al. | |
| 10,079,273 B2 | 9/2018 | Yang et al. | |
| 10,446,624 B2 * | 10/2019 | Yu | H01L 51/5231 |
| 10,490,768 B2 | 11/2019 | Baik et al. | |
| 10,580,834 B2 | 3/2020 | Ukigaya et al. | |
| 10,672,846 B2 | 6/2020 | Yang et al. | |
| 10,910,445 B2 | 2/2021 | Ukigaya et al. | |
| 2008/0036367 A1 | 2/2008 | Eida et al. | |
| 2008/0218070 A1 * | 9/2008 | Kobayashi | H10K 59/351 |
| | | | 313/506 |
| 2009/0079341 A1 * | 3/2009 | Tsai | H10K 59/122 |
| | | | 313/504 |
| 2009/0098680 A1 * | 4/2009 | Tsai | H10K 59/122 |
| | | | 257/E51.002 |
| 2011/0193107 A1 * | 8/2011 | Takeuchi | H10K 50/17 |
| | | | 257/E33.012 |
| 2011/0198990 A1 * | 8/2011 | Yoshida | H05B 33/10 |
| | | | 313/504 |
| 2011/0291086 A1 | 12/2011 | Nishiyama | |
| 2012/0025224 A1 | 2/2012 | Yuasa | |
| 2012/0248475 A1 | 10/2012 | Yamada et al. | |
| 2012/0299037 A1 * | 11/2012 | Lee | H10K 50/81 |
| | | | 257/98 |
| 2013/0248867 A1 * | 9/2013 | Kim | H10K 50/844 |
| | | | 438/34 |
| 2014/0077174 A1 * | 3/2014 | Park | H10K 71/00 |
| | | | 438/23 |
| 2015/0364529 A1 * | 12/2015 | Adachi | H10K 59/1216 |
| | | | 257/40 |
| 2016/0013251 A1 | 1/2016 | Yoshida et al. | |
| 2018/0033841 A1 | 2/2018 | Yang et al. | |
| 2018/0123081 A1 | 5/2018 | Baik et al. | |
| 2018/0182814 A1 * | 6/2018 | Kim | H10K 59/38 |
| 2019/0019852 A1 | 1/2019 | Yang et al. | |
| 2019/0043934 A1 | 2/2019 | Ukigaya et al. | |
| 2019/0369292 A1 | 12/2019 | Seo et al. | |
| 2020/0127221 A1 | 4/2020 | Lee et al. | |
| 2020/0161385 A1 | 5/2020 | Ukigaya et al. | |

FOREIGN PATENT DOCUMENTS

| | | |
|---|---|---|
| CN | 102272970 A | 12/2011 |
| CN | 102738200 A | 10/2012 |
| CN | 102960069 A | 3/2013 |
| CN | 107665903 A | 2/2018 |
| CN | 109390376 A | 2/2019 |
| JP | H05-158054 A | 6/1993 |
| JP | H10-268359 A | 10/1998 |
| JP | 2014-013717 A | 1/2014 |
| KR | 10-2017-0042415 A | 4/2017 |
| KR | 10-2018-0047270 A | 5/2018 |

OTHER PUBLICATIONS

United States Office Action, U.S. Appl. No. 17/028,571, dated Apr. 7, 2022, eight pages.

China National Intellectual Property Administration, Office Action, Chinese Patent Application No. 202011000334.0, dated Jul. 28, 2023, 16 pages.

* cited by examiner

DISPLAY DEVICE HAVING AN OXIDE INSULATING FILM BETWEEN SUBPIXELS AND METHOD FOR MANUFACTURING THE SAME

CROSS-REFERENCE TO RELATED APPLICATIONS

This application is a continuation application of application Ser. No. 17/028,571, filed on Sep. 22, 2020, which claims priority to Republic of Korea Patent Application No. 10-2019-0116576, filed on Sep. 23, 2019, all of which are hereby incorporated by reference in their entirety.

BACKGROUND

Technical Field

The present disclosure relates to a display device displaying an image.

Description of the Related Art

With advancement in information-oriented societies, requirements for display devices that display an image have increased in various types. Recently, various display devices such as a liquid crystal display (LCD) device, a plasma display panel (PDP) device, and an organic light emitting display (OLED) device have been widely utilized.

Head-mounted displays (HMD) including such an OLED device have been developed recently. A head-mounted display (HMD) device is a device that is worn in the form of an eyeglass or a helmet for virtual reality (VR) or augmented reality (AR) in which a focus is formed at a position close to a user's eyes. In a head mounted display, it is important to reduce a pixel interval and increase a light emission area to improve performance.

BRIEF SUMMARY

The present disclosure has been made in view of the above problems, and it is an object of the present disclosure to provide a display device that may reduce a pixel interval.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a substrate provided with a first subpixel and a second subpixel arranged to adjoin the first subpixel, a first electrode provided in each of the first subpixel and the second subpixel on the substrate, including a first material, and an oxide insulating film provided to cover at least a portion of a side of the first electrode and made of a second material. The first material is a metal material, and the second material is an oxide of the first material.

In accordance with another aspect of the present disclosure, the above and other objects can be accomplished by the provision of a method for manufacturing a display device comprising the steps of forming a reflective electrode material layer made of a reflective metal material in a first subpixel and a second subpixel arranged to adjoin the first subpixel on a substrate, forming a first stack on the reflective electrode material layer, forming a charge generating layer on the first stack, and performing plasma treatment for the reflective electrode material layer, the first stack and the charge generating layer, which are provided between the first subpixel and the second subpixel.

According to the present disclosure, the reflective electrode material layer may be formed as an oxide insulating film, whereby a separate bank may not be formed between the subpixels. The present disclosure may minimize an interval between the subpixels.

Also, in the present disclosure, since the oxide insulating film is only provided at a side of the reflective electrode, an area where the reflective electrode is formed may be the light emission area. Therefore, the present disclosure may maximize the light emission area.

Also, in the present disclosure, the first stack and the charge generating layer provided between the subpixels may be removed by plasma treatment of one time and at the same time the oxide insulating film may be formed. Therefore, the present disclosure may simplify a manufacturing process and reduce a manufacturing cost.

Also, in the present disclosure, the first stack and the charge generating layer may be formed to be patterned per subpixel. Therefore, in the present disclosure, even though an interval between the subpixels is reduced, a leakage current may not occur between adjacent subpixels.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
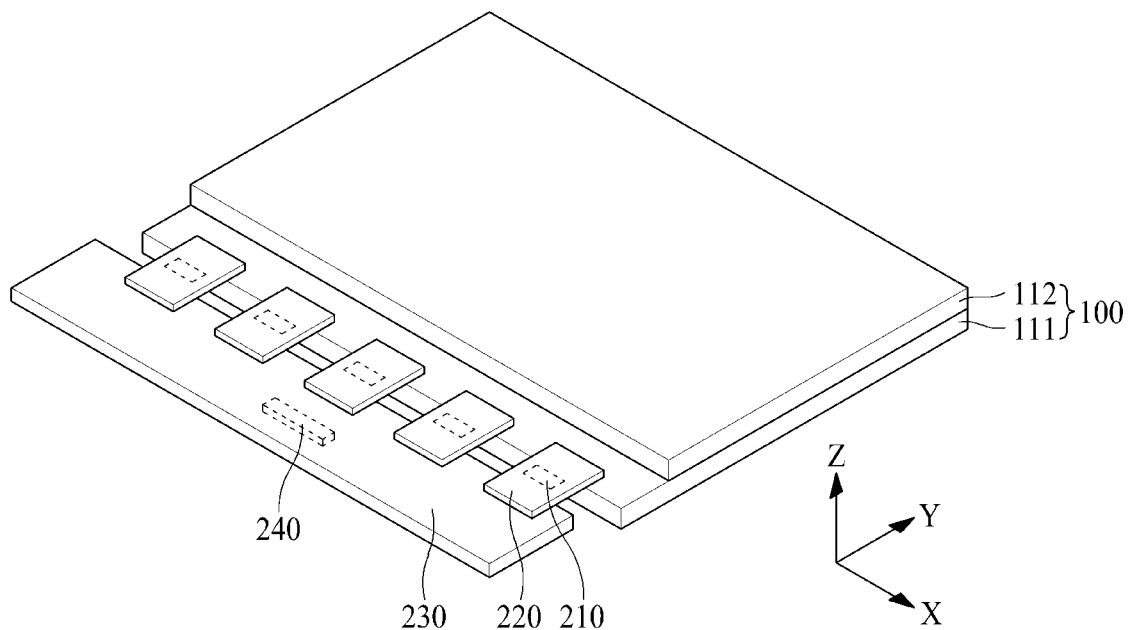
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to the present disclosure will be described in detail with reference to the accompanying drawings. Wherever possible, the same reference numbers will be used throughout the drawings to refer to the same or like parts.

FIG. 1 is a perspective view illustrating a display device according to one embodiment of the present disclosure.

Referring to FIG. 1, the display device according to one embodiment of the present disclosure includes a display panel 100, a source drive integrated circuit 210 (hereinafter, referred to as "IC"), a flexible film 220, a circuit board 230, and a timing controller 240.

The display panel 100 includes a first substrate 111 and a second substrate 112. The second substrate 112 may be an encapsulation substrate.

On one surface of the first substrate 111 confronting the second substrate 112, there are gate lines, data lines, and pixels. The pixels are prepared in respective areas defined by crossing the gate lines and the data lines.

Each of the pixels may include a thin film transistor, and a light emitting device including an anode electrode, an emission layer, and a cathode electrode. If a gate signal is supplied from the gate line to each pixel through the use of thin film transistor, a predetermined current is supplied to the light emitting device in accordance with a data voltage of the data line. Accordingly, when a high potential voltage is applied to the anode electrode, and a low potential voltage is applied to the cathode electrode, the light emitting device for each of the pixels may emit light with a predetermined brightness in accordance with the predetermined current.

The display panel 100 may include a display area provided with the sub pixels for displaying an image, and a non-display area in which an image is not displayed. The gate lines, the data lines, and the pixels may be provided in the display area, and a gate driver and pads may be provided in the non-display area.

The gate driver supplies gate signals to the gate lines in accordance with a gate control signal which is provided from the timing controller 240. The gate driver may be provided in one side of the display area of the display panel 100, or the non-display area of both peripheral sides of the display panel 100 by a gate driver in panel (GIP) method. In another way, the gate driver may be manufactured in a driving chip, may be mounted on the flexible film, and may be attached to one side of the display area of the display panel 100, or the non-display area of both peripheral sides of the display panel 100 by a tape automated bonding (TAB) method.

The source drive IC 210 receives digital video data and source control signals from the timing controller 240. The source drive IC 210 converts the digital video data into analog data voltages in accordance with the source control signal, and supplies the analog data voltages to the data lines. If the source drive IC 210 is manufactured in a driving chip, the source drive IC 210 may be mounted on the flexible film 220 by a chip on film (COF) method or a chip on plastic (COP) method.

The pads such as data pads may be provided in the non-display area of the display panel 100. In the flexible film 220, there are lines for connecting the pads with the source drive IC 210, and lines for connecting the pads with the lines of the circuit board 230. The flexible film 220 is attached to the pads by the use of anisotropic conducting film, whereby the pads may be connected with the lines of the flexible film 210.

The circuit board 230 may be attached to the flexible film 220. A plurality of circuits, which are realized in a plurality of driving chips, may be mounted on the circuit board 230. For example, the timing controller 240 may be mounted on the circuit board 230. The circuit board 230 may be a printed circuit board or a flexible printed circuit board.

The timing controller 240 receives digital video data and a timing signal from an external system board via a cable of the circuit board 230. The timing controller 240 generates the gate control signal for controlling an operation timing of the gate driver and the source control signal for controlling the source drive IC 210 on the basis of the timing signal. The timing controller 240 supplies the gate control signal to the gate driver, and supplies the source control signal to the source drive IC 210.

Figure 2:
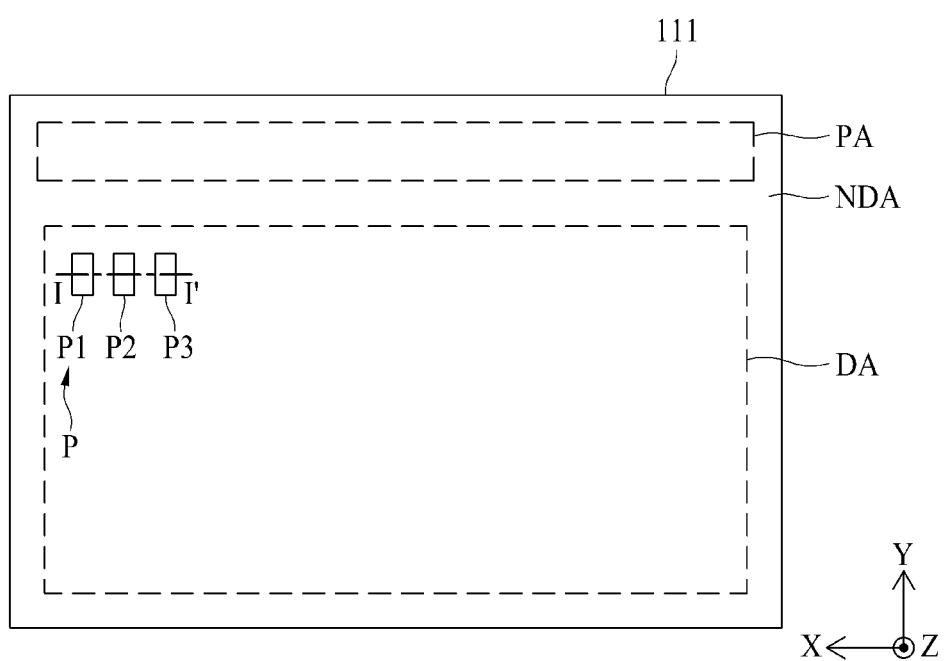
FIG. 2 is a plane view illustrating a first substrate according to one embodiment of the present disclosure.
Figure 3:
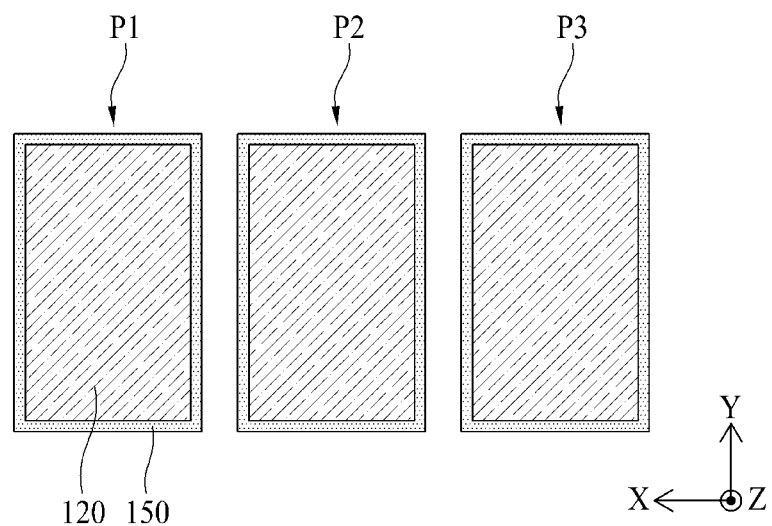
FIG. 3 is a plane view illustrating a first electrode and an oxide insulating film of subpixels according to one embodiment of the present disclosure.
Figure 4:
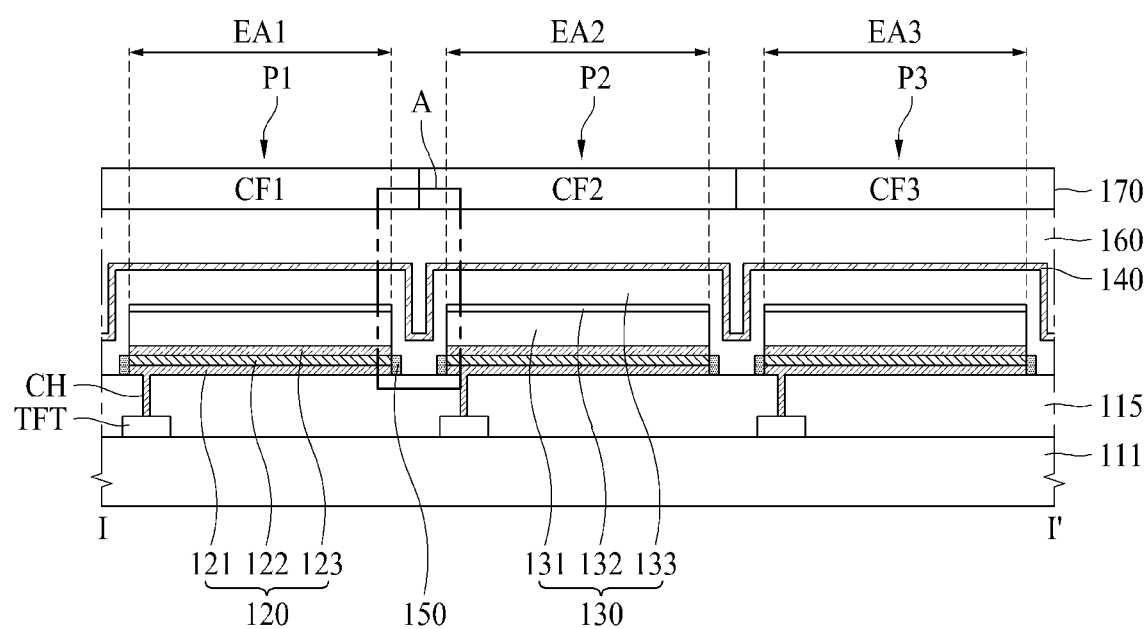
FIG. 4 is a cross-sectional view illustrating an example taken along line I-I' of FIG. 2 according to one embodiment of the present disclosure.
Figure 5:
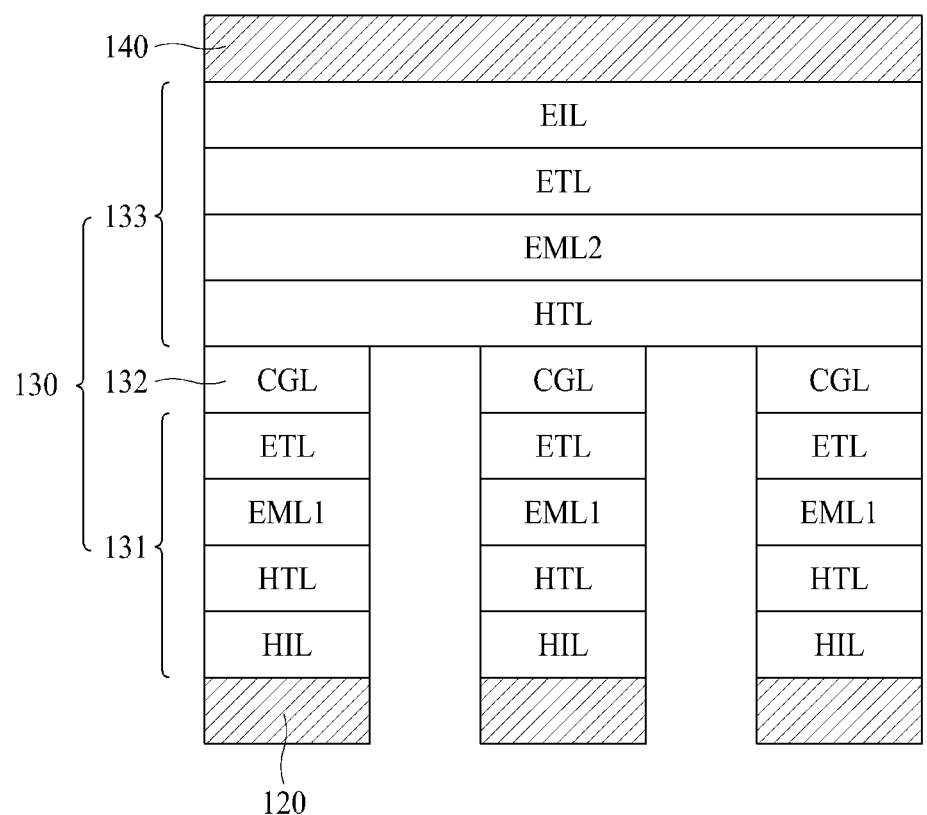
FIG. 5 is a detailed cross-sectional view illustrating an example of a first electrode, a light emitting layer, and a second electrode of a display device according to one embodiment of the present disclosure.
Figure 6:
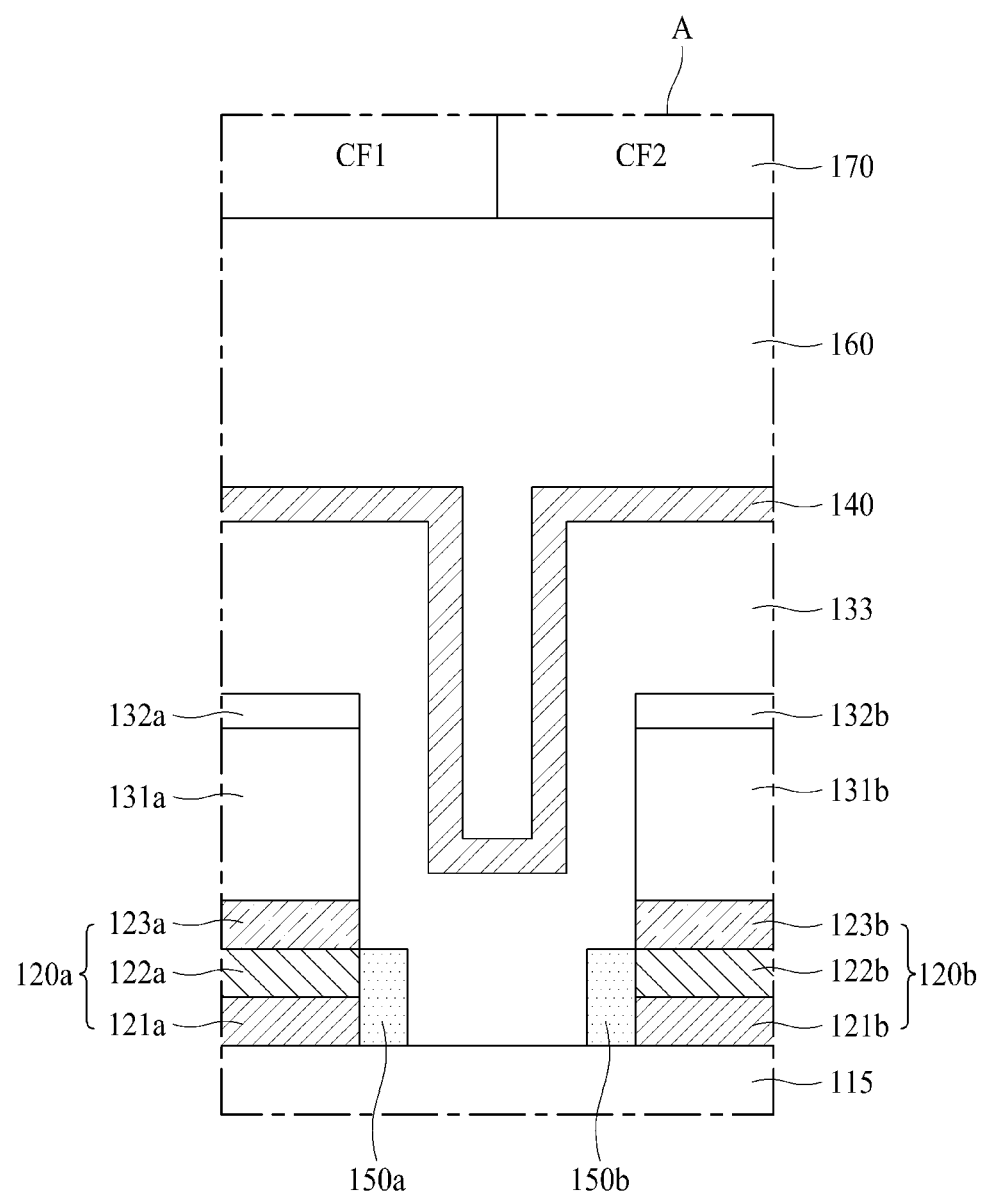
FIG. 6 is an enlarged view illustrating an area A of FIG. 4 according to one embodiment of the present disclosure.
Figure 7:
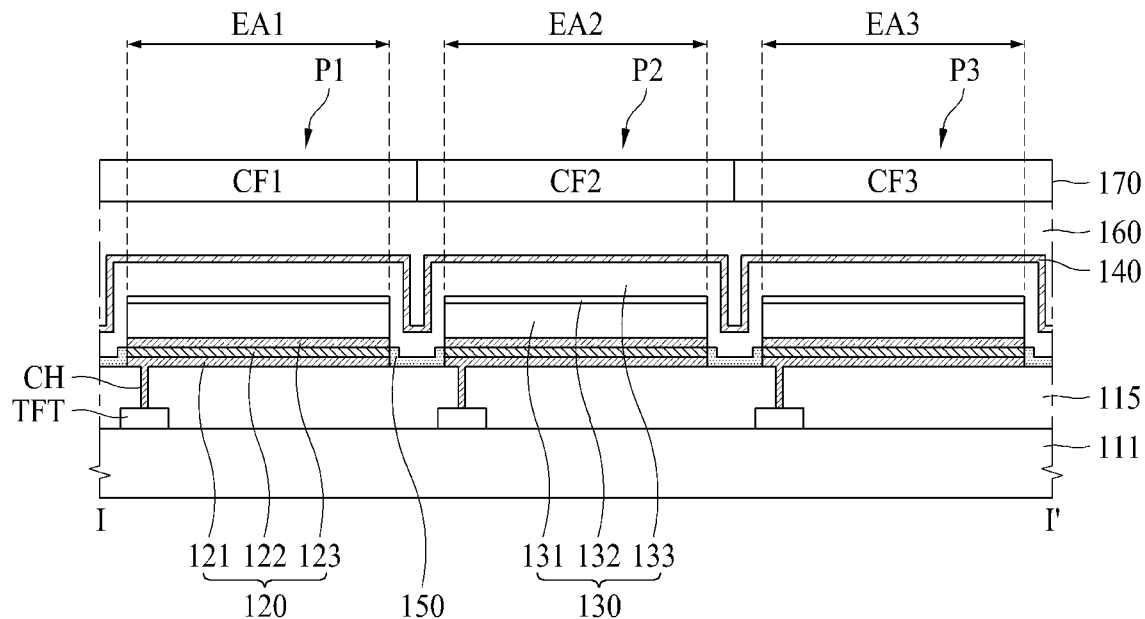
FIG. 7 is a cross-sectional view illustrating a modified example of FIG. 4 according to one embodiment of the present disclosure.

FIG. 2 is a plane view illustrating a first substrate according to one embodiment of the present disclosure, FIG. 3 is a plane view illustrating a first electrode and an oxide insulating film of subpixels according to one embodiment of the present disclosure, FIG. 4 is a cross-sectional view illustrating an example taken along line I-I' of FIG. 2 according to one embodiment of the present disclosure, FIG. 5 is a detailed cross-sectional view illustrating an example of a first electrode, a light emitting layer, and a second electrode of a display device according to one embodiment of the present disclosure, FIG. 6 is an enlarged view illustrating an area A of FIG. 4 according to one embodiment of the present disclosure, and FIG. 7 is a cross-sectional view illustrating a modified example of FIG. 4 according to one embodiment of the present disclosure.

Referring to FIGS. 2 to 7, the first substrate 111 is divided into a display area DA and a non-display area NDA. In the non-display area NDA, there is a pad area PA for pads.

The data lines and the gate lines crossing the data lines may be provided in the display area DA. Pixels P displaying an image in a crossing area of the data line and the gate line may be provided in the display area DA.

The pixels P may include a first sub pixel P1, a second sub pixel P2, and a third sub pixel P3. The first sub pixel P1 is configured to emit red colored light, the second sub pixel P2 is configured to emit blue colored light, and the third sub pixel P3 is configured to emit green colored light, but not limited to this structure. A fourth sub pixel, which is configured to emit white colored light, may be provided in the display area DA of the first substrate 111.

If a gate signal is supplied from the gate line to each of the sub pixels P1, P2, and P3 a predetermined current is supplied to the light emitting device in accordance with a data voltage of the data line. Accordingly, the light emitting device for each of the sub pixels P1, P2, and P3 may emit light with a predetermined brightness in accordance with the predetermined current. In addition, the power lines supply a power voltage to each of the sub pixels P1, P2, and P3.

Referring to FIGS. 3 to 7, a thin film transistor TFT, an inter-layer dielectric film 115, a first electrode 120, a light emitting layer 130, a second electrode 140, an encapsulation film 160, a color filter 170 and an oxide insulating film 150 are provided over one surface of a first substrate 111 facing a second substrate 112.

The first substrate 111 may be made of, but not limited to, glass or plastic. The first substrate 111 may be made of a semiconductor material such as silicon wafer. The first substrate 111 may be made of a transparent material or an opaque material.

The display device according to one embodiment of the present disclosure may be formed in a top emission type where emitted light advances upwardly, but not limited to this type. If the display device is formed in the top emission type where emitted light advances upwardly, the first substrate 111 may be formed of an opaque material as well as a transparent material.

A circuit element which includes various signal lines, a thin film transistor and a capacitor is provided over the first substrate 111 for each of subpixels P1, P2, and P3. The signal lines may include a gate line, a data line, a power line, and a reference line. The thin film transistor may include a switching thin film transistor, a driving thin film transistor TFT and a sensing thin film transistor.

The switching thin film transistor is switched by a gate signal supplied to the gate line, and the switching thin film transistor supplies a data voltage, which is supplied from the data line, to the driving thin film transistor TFT.

The driving thin film transistor TFT is switched by the data voltage supplied from the switching thin film transistor, and the driving thin film transistor TFT generates a data current from power source supplied from the power line, and supplies the data current to the first electrode 120.

The sensing thin film transistor senses a deviation of threshold voltage in the driving thin film transistor TFT, which causes a deterioration of picture quality. The sensing thin film transistor supplies a current of the driving thin film transistor TFT to the reference line in response to a sensing control signal supplied from the gate line or an additional sensing line.

The capacitor maintains the data voltage supplied to the driving thin film transistor TFT for one frame period, and the capacitor is connected with each of gate and source terminals of the driving thin film transistor TFT.

The inter-layer dielectric film 115 is provided over the circuit element that includes the driving thin film transistor TFT. The inter-layer dielectric film 115 may be formed of an inorganic layer, and for example, may be formed of SiOx, SiNx, or a multilayer thereof. The inter-layer dielectric film 115 may be formed of an organic layer, and for example, may be formed of an acryl resin, an epoxy resin, a phenolic resin, a polyamide resin, or a polyimide resin. Alternatively, the inter-layer dielectric film 115 may be formed of a multiple layer composed of at least one inorganic layer and at least one organic layer.

The first electrode 120 is provided to be patterned over the inter-layer dielectric film 115 for each of the subpixels P1, P2, and P3. One of the first electrode is patterned in the first sub pixel P1, another first electrode is patterned in the second sub pixel P2, and another first electrode is patterned in the third sub pixel P3.

The first electrode 120 is connected to the driving thin film transistor TFT. In detail, the first electrode 120 is connected to a source terminal or a drain terminal of the driving thin film transistor TFT through a contact hole CH that passes through the inter-layer dielectric film 115, whereby a voltage for emitting light is applied to the first electrode 120. The first electrode 120 may be the anode electrode.

The first electrode 120 according to one embodiment of the present disclosure may include at least one layer made of a first material. At this time, the first material may be a metal material of high reflexibility.

The display device may be provided in a top emission type in which light emitted from the light emitting layer 130 is emitted to a top portion. In this case, the first electrode 120 may include at least one layer made of a metal material of high reflexibility. The first electrode 120 may reflect the light emitted from the light emitting layer 130 toward the top portion.

In detail, the first electrode 120 may include a lower electrode 121, a reflective electrode 122, and an upper electrode 123.

The lower electrode 121 is provided over the inter-layer insulating film 115 for each of subpixels P1, P2, and P3. One lower electrode is provided in the first subpixel P1, another lower electrode is provided in the second subpixel P2, and the other lower electrode is provided in the third subpixel P3.

The lower electrode 121 is connected with a driving thin film transistor TFT. In detail, the lower electrode 121 is connected to a source terminal or drain terminal of the driving thin film transistor TFT through a contact hole CH that passes through the inter-layer dielectric film 115, whereby a voltage for emitting light is applied to the lower electrode 121.

The lower electrode 121 may be a transparent electrode made of a transparent metal material. For example, the lower electrode 121 may be formed of a transparent conductive material (TCO) such as ITO and IZO.

The reflective electrode 122 is provided over the lower electrode 121 for each of the subpixels P1, P2, and P3. One reflective electrode is provided in the first subpixel P1, another reflective electrode is provided in the second subpixel P2, and the other reflective electrode is provided in the third subpixel P3.

The reflective electrode 122 may be a reflective electrode that reflects light emitted from the light emitting layer 130 toward an upper portion. For example, the reflective electrode 122 may be formed of a metal material of high reflexibility, such as Al, Ag, and Ag alloy. Ag alloy may be an alloy of Ag, Pd and Cu.

The upper electrode 123 is provided over the reflective electrode 122 for each of subpixels P1, P2 and P3. One upper electrode is provided in the first subpixel P1, another upper electrode is provided in the second subpixel P2, and the other upper electrode is provided in the third subpixel P3.

The upper electrode 123 is electrically connected with the source terminal or drain terminal of the driving thin film transistor TFT. In detail, the upper electrode 123, as shown in FIG. 4, may electrically be connected with the source terminal or drain terminal of the driving thin film transistor TFT through the lower electrode 121 and the reflective electrode 122, but is not limited to this example. The upper electrode 123 may directly be connected with the source terminal or drain terminal of the driving thin film transistor TFT.

The upper electrode 123 may be a transparent electrode made of a transparent metal material. For example, the upper electrode 123 may be formed of a transparent conductive material (TCO) such as ITO and IZO. The lower electrode 121 and the upper electrode 123 may be formed of the same material, or may be formed of their respective materials different from each other.

Although FIGS. 4 and 6 show that the first electrode 120 has a three-layered structure, the first electrode 120 is not limited to the examples of FIGS. 4 and 6. The first electrode 120 has only to include a reflective electrode 122 made of a reflective metal material, and at least one of the upper electrode 123 and the lower electrode 121 may be omitted.

In another embodiment, the first electrode 120 may have a multi-layered structure that includes the reflective electrode 122. In still another embodiment, the first electrode 120 may have a two-layered structure that includes the reflective electrode 122 and the upper electrode 123. In further still another embodiment, the first electrode 120 may have a two-layered structure that includes the lower electrode 121 and the reflective electrode 122.

The oxide insulating film 150 is provided among the first to third subpixels P1, P2, and P3. The oxide insulating film 150 is made of a second material, and has insulating property. At this time, the second material may be an oxide of a first material constituting the reflective electrode 122. For example, the first material may be made of Al, and the second material may be made of aluminum oxide ($Al_xO_y$). For another example, the first material may be made of Ag, and the second material may be made of $Ag_xO_y$.

The oxide insulating film 150 is provided among the first electrodes 120 respectively provided in the first to third subpixels P1, P2, and P3. Since the oxide insulating film 150 has insulating property, the oxide insulating film 150 may block the first electrodes 120 respectively provided in the first to third subpixels P1, P2, and P3 from being electrically connected with one another.

In detail, the oxide insulating film 150 is provided between the first electrode 120a provided in one subpixel and the first electrode 120b provided in another adjacent subpixel. At this time, the oxide insulating film 150 may be provided at a side of each of the first electrode 120a provided in one subpixel and the first electrode 120b provided in another adjacent subpixel.

A first side of the first electrode 120a provided in one subpixel may face a second side of the first electrode 120b provided in another subpixel. The oxide insulating film 150 may include an oxide insulating film 150a provided on the first side of the first electrode 120a provided in one subpixel and an oxide insulating film 150b provided on the second side of the first electrode 120b provided in another subpixel. At this time, the oxide insulating film 150a provided on the first side of the first electrode 120a provided in one subpixel and the oxide insulating film 150b provided on the second side of the first electrode 120b provided in another subpixel may be spaced apart from each other as shown in FIGS. 4 and 6 but are not limited to the examples of FIGS. 4 and 6.

In another embodiment, the oxide insulating film 150a provided on the first side of the first electrode 120a provided in one subpixel and the oxide insulating film 150b provided on the second side of the first electrode 120b provided in another subpixel may be connected with each other as shown in FIG. 7. That is, the oxide insulating film 150 may be extended from the side of the first electrode 120a provided in one subpixel to the side of the first electrode 120b provided in another subpixel.

Since the oxide insulating films 150a and 150b have insulating property, the oxide insulating films may block the first side of the first electrode 120a provided in one subpixel from being electrically connected with the second side of the first electrode 120b provided in another subpixel. Therefore, the first electrode 120a provided in one subpixel and the first electrode 120b provided in another subpixel may not affect each other electrically even though a pixel interval is reduced.

The oxide insulating film 150 may be provided at the side of the reflective electrode 122.

The oxide insulating film 150 may be formed by change of the first material constituting the reflective electrode 122 to the second material by plasma treatment. In detail, in a manufacturing process of the display device, a first material layer constituting the reflective electrode 122 may be provided over the inter-layer dielectric film 115. At this time, the first material layer may cover the subpixels P1, P2, and P3 and have an area greater than the subpixels P1, P2, and P3 but is not limited to this example. The first material layer may be provided over an entire surface while covering the subpixels P1, P2, and P3.

If the first material layer formed among the subpixels P1, P2, and P3 is plasma-treated using $O_2$ gas, the first material is changed to the second material. At this time, the portion of the first material layer changed from the first material to the second material may become the oxide insulating film 150, and another portion of the first material layer where the first material remains may become the reflective electrode 122. As a result, the oxide insulating film 150 is formed at the side of the reflective electrode 122.

The oxide insulating film 150 is not formed in a layer different from the reflective electrode 122, and may be formed in a single body with the reflective electrode 122. A portion in one layer becomes the oxide insulating film 150, and the other in one layer becomes the reflective electrode 122. Therefore, the oxide insulating film 150 is provided at the side of the reflective electrode 122 but is not provided on an upper surface or lower surface of the reflective electrode 122.

In the display device according to one embodiment of the present disclosure, the reflective electrode 122 may define a light emission area EA of each of the subpixels P1, P2, and P3. That is, areas in the subpixels P1, P2 and P3, in which the reflective electrode 122 is provided, may become light emission areas EA1, EA2, and EA3.

Meanwhile, the first electrode 120 may include at least one layer provided between the reflective electrode 122 and the inter-layer insulating film 115. In this case, the oxide insulating film 150 may be provided at the side of the reflective electrode 122 and a side of at least one layer provided between the reflective electrode 122 and the inter-layer dielectric film 115.

For example, if the lower electrode 121 is provided between the reflective electrode 122 and the inter-layer dielectric film 115, the oxide insulating film 150 may be provided at the side of the reflective electrode 122 and the side of the lower electrode 121. In detail, in the manufacturing process of the display device, the lower electrode 121 may be provided to be patterned over the inter-layer dielectric film 115 for each of the subpixels P1, P2, and P3. At this time, the lower electrode 121 may be patterned in each of the subpixels P1, P2, and P3 to substantially have the same area as the subpixels P1, P2, and P3. Then, the first material layer constituting the reflective electrode 122 may be formed over the lower electrode 121. At this time, the first material layer may be patterned to cover the subpixels P1, P2, and P3 and have an area greater than the subpixels P1, P2, and P3 but is not limited to this example. The first material layer may be formed over the entire surface while covering the subpixels P1, P2, and P3. Since the first material layer has an area wider than the lower electrode 121, the first material layer may be formed to cover the side of the lower electrode 121.

If the first material provided in the subpixels P1, P2, and P3 is plasma-treated using $O_2$ gas, the first material is changed to the second material. At this time, the portion of the first material layer changed from the first material to the second material may become the oxide insulating film 150, and another portion of the first material layer where the first material remains may become the reflective electrode 122. As a result, the oxide insulating film 150 may be formed at the side of the reflective electrode 122 and the side of the lower electrode 121.

The light emitting layer 130 is provided over the first electrode 120. The light emitting layer 130 may be a white light emitting layer emitting white light. In this case, the light emitting layer 130 may be a common layer commonly provided in the subpixels P1, P2, and P3.

The light emitting layer 130, as shown in FIG. 4, includes a first stack 131 emitting light of a first color, a second stack 133 emitting light of a second color, and a charge generating layer (CGL) 132 provided between the first stack and the second stack.

The first stack 131 is provided over the first electrode 120 for each of the subpixels P1, P2, and P3. In detail, the first stack 131 may include a first stack 131a provided in one subpixel and a first stack 131b provided in another adjacent pixel. At this time, the first stack 131a provided in one subpixel and the first stack 131b provided in another adjacent pixel are spaced apart from each other as shown in FIGS. 4, 5, and 6.

In the manufacturing process of the display device, material layers constituting the first stack 131 may be provided over the inter-layer dielectric film 115, the first electrode 120 and the oxide insulating film 150 without using a mask. Then, the material layers constituting the first stack 131 provided among the subpixels P1, P2, and P3 may be removed by plasma treatment. Therefore, the first stack 131 may be provided to be patterned for each of the subpixels P1, P2, and P3.

$O_2$ gas may be used for plasma treatment for forming the first stack 131, and this plasma treatment may be equal to that for forming the oxide insulating film 150. That is, in the display device according to one embodiment of the present disclosure, the oxide insulating film 150 and the first stack 131 may be formed simultaneously by plasma treatment of one time. In this case, in the display device according to one embodiment of the present disclosure, an area for forming the reflective electrode 122 may substantially be the same as an area for forming the first stack 131. This is because the reflective electrode 122 and the first stack 131 are formed in an area that is not exposed to $O_2$ gas during plasma treatment.

The first stack 131 may be provided in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The charge generating layer 132 is provided to be patterned over the first stack 131 for each of the subpixels P1, P2, and P3. In detail, the charge generating layer 132 includes a charge generating layer 132a provided in one subpixel and a charge generating layer 132b provided in another adjacent subpixel. At this time, the charge generating layer 132a provided in one subpixel and the charge generating layer 132b provided in another adjacent pixel are spaced apart from each other as shown in FIGS. 4, 5, and 6.

In the manufacturing process of the display device, material layers constituting the first stack 131 may be provided over the inter-layer dielectric film 115, the first electrode 120 and the oxide insulating film 150 without using a mask. Then, a material layer constituting the charge generating layer 132 may be formed over the material layers constituting the first stack 131 without using a mask. Then, the material layers constituting the first stack 131 formed among the subpixels P1, P2, and P3 and the material layer constituting the charge generating layer 132 may be removed by plasma treatment. Therefore, the first stack 131 and the charge generating layer 132 may be formed to be patterned for each of the subpixels P1, P2, and P3.

$O_2$ gas may be used for plasma treatment for forming the first stack 131 and the charge generating layer 132, and this plasma treatment may be equal to that for forming the oxide insulating film 150. That is, in the display device according to one embodiment of the present disclosure, the oxide insulating film 150, the first stack 131 and the charge generating layer 132 may be formed simultaneously by plasma treatment of one time. In this case, in the display device according to one embodiment of the present disclosure, an area for forming the reflective electrode 122, an area for forming the first stack 131 and an area for forming the charge generating layer 132 may substantially be the same as one another. This is because that the reflective electrode 122, the first stack 131 and the charge generating layer 132 are formed in an area that is not exposed to $O_2$ gas during plasma treatment.

The charge generating layer 132 may be formed of a deposited structure of an N type charge generating layer for supplying electrons to the first stack 131 and a P type charge generating layer for supplying holes to the second stack 133.

The second stack 133 is provided over the charge generating layer 132. The second stack 133 is provided in the subpixels P1, P2, and P3 and among the subpixels P1, P2, and P3. That is, the second stack 133 is also connected among the subpixels P1, P2, and P3 unlike the first stack 131 and the charge generating layer 132.

The second stack 133 may be provided at the side of each of the first stack 131 and the charge generating layer 132, which are exposed by plasma treatment. Also, if the upper electrode 123 is provided over the reflective electrode 122, the second stack 133 may be provided at the side of the upper electrode, which is exposed as the oxide insulating film 150 is not formed thereon. The second stack 133 may be formed at the side of the upper electrode 123, whereby the second electrode 140 and the upper electrode 123 may be prevented from being short-circuited.

The second stack 133 may be provided in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

In the display device according to one embodiment of the present disclosure, since the charge generating layers 132 of the subpixels P1, P2, and P3 are spaced apart from one another, it is difficult to move charges through the charge generating layer 132 among the adjacent subpixels P1, P2, and P3. The light emitting layer 130 according to one embodiment of the present disclosure may allow the adjacent subpixels P1, P2, and P3 to be affected by a leakage current within a minimum range.

The second electrode 140 is provided over the light emitting layer 130. The second electrode 140 may be a common layer commonly provided for the subpixels P1, P2, and P3.

The second electrode 140 may be formed of a transparent metal material, a semi-transmissive metal material, or a metal material with high reflectance. If the display device is formed in the top emission type, the second electrode 140 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The second electrode 140 may be a cathode electrode.

The encapsulation film 160 may be provided to overlay the second electrode 140. The encapsulation film 160 serves to prevent oxygen or water from being permeated into the second electrode 140 and the light emitting layer 130. To this end, the encapsulation film 160 may include at least one inorganic film and at least one organic film.

In detail, the encapsulation film 160 may include a first inorganic film and an organic film. In one embodiment, the encapsulation film 160 may further include a second inorganic film.

The first inorganic film is provided to overlay the second electrode 140. The organic film is provided over the first inorganic film. It is preferable that the organic film is formed at a sufficient thickness to prevent particles from being permeated into the light emitting layer 130 and the second electrode 140 by passing through the first inorganic film. The second inorganic film is provided to overlay the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be obtained by a vapor deposition method, a printing method, or a slit coating method, but not limited to these methods. The organic film may be obtained by an ink-jet method.

The color filter 170 is provided over the encapsulation film 160. The color filter 170 includes a first color filter CF1, a second color filter CF2 and a third color filter CF3, which are arranged to respectively correspond to the subpixels P1, P2, and P3. The first color filter CF1 may be a red color filter transmitting red light, the second color filter CF2 may be a green color filter transmitting green light, and the third color filter CF3 may be a blue color filter transmitting blue light.

In the display device according to one embodiment of the present disclosure, the oxide insulating film 150 is provided at the side of the first electrode 120. The oxide insulating film 150 may be formed in such a manner that a first material included in the first electrode 120 is oxidized. That is, a portion in one layer becomes the oxide insulating film 150, and the other in one layer becomes the first electrode 120, exactly the reflective electrode 122.

In the display device according to one embodiment of the present disclosure, a separate bank may not be provided among the first electrodes 120 provided in the subpixels P1, P2, and P3. In the display device of the related art, a bank is provided among the first electrodes 120 provided in the subpixels P1, P2, and P3. In this case, in the display device of the related art, an interval among the first electrodes 120 provided in the subpixels P1, P2, and P3 is designed considering a design margin for forming a bank. Therefore, the display device of the related art has limitation in reducing the interval among the subpixels P1, P2, and P3.

Also, in the display device of the related art, after the first electrode 120 is formed to be patterned for each of the subpixels P1, P2, and P3, the bank is formed. At this time, the bank is formed to overlay ends of the first electrode 120 formed to be patterned in each of the subpixels P1, P2, and P3. The bank is also formed at an upper corner of the first electrode 120 as well as the side of the first electrode 120. In this way, as the bank is formed over the upper surface of the first electrode 120, the light emission area is reduced.

Also, if ultra-high resolution such as a head mounted display is required, a light emission area of one subpixel becomes smaller and a current density become higher, whereby a problem occurs in that element lifetime is reduced.

In the display device according to one embodiment of the present disclosure, since a portion in one layer becomes the oxide insulating film 150 and the other in one layer becomes the reflective electrode 122, the oxide insulating film 150 is provided at the side of the reflective electrode 122 but is not provided over the upper surface or lower surface of the reflective electrode 122. Therefore, in the display device according to one embodiment of the present disclosure, areas where the reflective electrode 122 is formed may become light emission areas EA1, EA2, and EA3. In the display device according to one embodiment of the present disclosure, the light emission areas EA1, EA2, and EA3 may be increased or maximized. Therefore, in the display device according to one embodiment of the present disclosure, an opening rate may be maximized or increased to minimize or reduce a current density and improve element lifetime.

Also, in the display device according to one embodiment of the present disclosure, the reflective electrode 122 and the oxide insulating film 150 are formed as one layer not a separate layer. Therefore, since the oxide insulating film 150 is not formed over the reflective electrode 122 through a separate process, a design margin for forming the oxide insulating film 150 is smaller than a design margin for forming the bank. Therefore, in the display device according to one embodiment of the present disclosure, the interval among the subpixels P1, P2, and P3 may be reduced or minimized.

Also, in the display device according to one embodiment of the present disclosure, the first stack 131 and the charge generating layers 132 may be formed to be patterned for each of the subpixels P1, P2, and P3. In the display device according to one embodiment of the present disclosure, since it is difficult to move charges through the charge generating layer 132 among the adjacent subpixels P1, P2, and P3, a leakage current may be prevented from occurring among the subpixels P1, P2, and P3.

Also, in the display device according to one embodiment of the present disclosure, the first stack 131 and the charge generating layers 132 provided among the subpixels P1, P2, and P3 may be removed by plasma treatment of one time and at the same time the oxide insulating film 150 may be formed. In the display device according to one embodiment of the present disclosure, the first stack 131 and the charge generating layer 132 may be formed to be patterned for each of the subpixels P1, P2, and P3 even without using a separate mask. Therefore, in the display device according to one embodiment of the present disclosure, a manufacturing process may be simplified and therefore a manufacturing cost may be reduced.

Also, in the display device according to one embodiment of the present disclosure, the second stacks 133 of the light emitting layer 130 are connected among the subpixels P1, P2, and P3. Therefore, even though the side of the first electrode 120 is partially exposed by plasma treatment, the first electrode 120 and the second electrode 140 may be prevented from being short-circuited.

Meanwhile, a white light emitting layer is commonly provided for the subpixels P1, P2, and P3 in the description of FIGS. 4 to 7 but is not limited to this example. In another embodiment, the display device may comprise a red light emitting layer, a green light emitting layer, and a blue light emitting layer, respectively for the subpixels P1, P2, and P3. Hereinafter, the display device according to another embodiment of the present disclosure will be described in detail with reference to FIG. 8.

Figure 8:
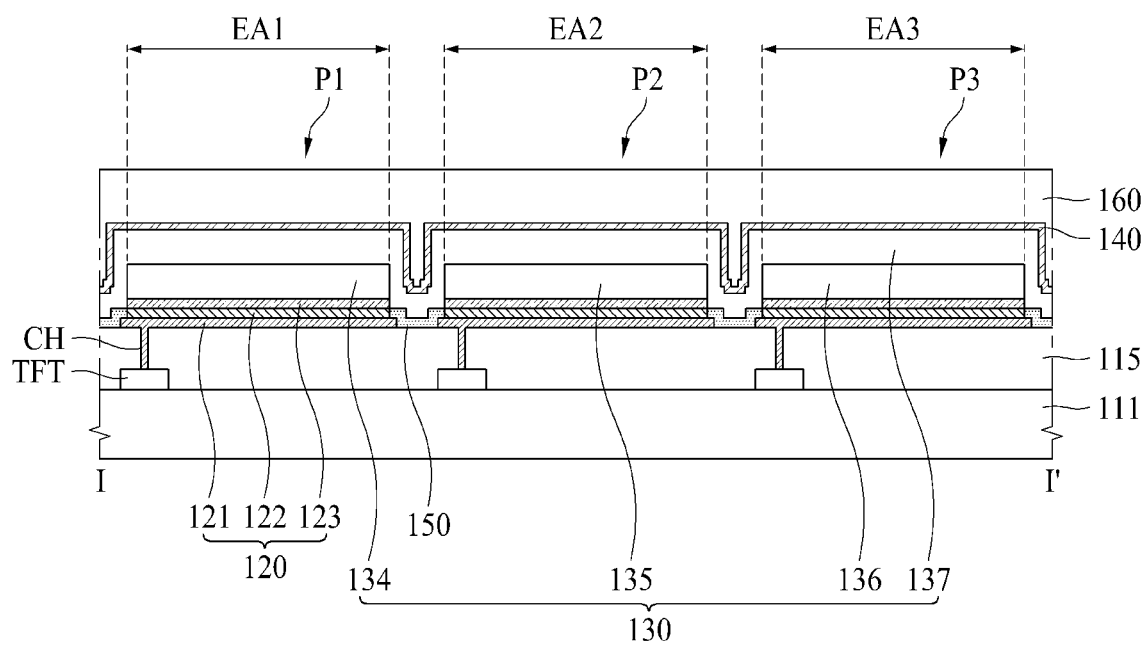
FIG. 8 is a cross-sectional view illustrating a display device according to another embodiment of the present disclosure.
Figure 9:
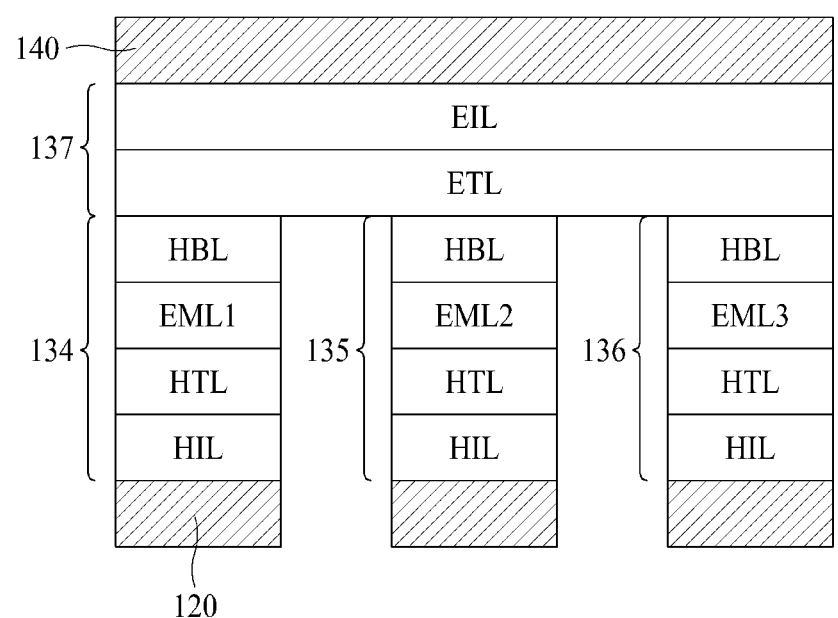
FIG. 9 is a detailed cross-sectional view illustrating an example of a first electrode, a light emitting layer, and a second electrode of a display device according to another embodiment of the present disclosure.

FIG. 8 is a cross-sectional view illustrating a display device according to another embodiment of the present disclosure, and FIG. 9 is a detailed cross-sectional view illustrating an example of a first electrode, a light emitting layer, and a second electrode of a display device according to another embodiment of the present disclosure.

Referring to FIGS. 8 and 9, the display device according to another embodiment of the present disclosure may comprise a first substrate 111, a driving thin film transistor TFT, an inter-layer dielectric film 115, a first electrode 120, a light emitting layer 130, a second electrode 140, an encapsulation film 160, and an oxide insulating film 150.

Since the first substrate 111, the driving thin film transistor TFT, the inter-layer dielectric film 115, the first electrode 120, the encapsulation film 160, and the oxide insulating film 150, which are shown in FIG. 8, are substantially the same or similar as the first substrate 111, the driving thin film transistor TFT, the inter-layer dielectric film 115, the first electrode 120, the encapsulation film 160, and the oxide insulating film 150, which are shown in FIGS. 4 to 7, their detailed description will be omitted.

The light emitting layer 130 according to another embodiment of the present disclosure may be a red light emitting layer, a green light emitting layer, and a blue light emitting layer. In this case, the red light emitting layer, the green light emitting layer, and the blue light emitting layer may respectively be formed to be patterned for the subpixels P1, P2, and P3. For example, the red light emitting layer may be formed to be patterned in the first subpixel P1, the green light emitting layer may be formed to be patterned in the second subpixel P2, and the blue light emitting layer may be formed to be patterned in the third subpixel P3.

In detail, as shown in FIGS. 8 and 9, the light emitting layer 130 may include a first light emitting layer 134, a second light emitting layer 135, a third light emitting layer 136, and a common layer 137. The first light emitting layer 134 is provided to be patterned in the first subpixel P1, and may include, but is not limited to, a deposited structure of a hole injecting layer HIL, a hole transporting layer HTL, a first light emitting layer EML1 emitting light of a first color, and a hole blocking layer HBL, which are deposited in due order. The first light emitting layer EML1 may emit red light, but is not limited to this example.

The second light emitting layer 135 is provided to be patterned in the second subpixel P2, and may include, but is not limited to, a deposited structure of a hole injecting layer HIL, a hole transporting layer HTL, a second light emitting layer EML2 emitting light of a second color, and a hole blocking layer HBL, which are deposited in due order. The second light emitting layer EML2 may emit green light, but is not limited to this example.

The third light emitting layer 136 is provided to be patterned in the third subpixel P3, and may include, but is not limited to, a deposited structure of a hole injecting layer HIL, a hole transporting layer HTL, a third light emitting layer EML3 emitting light of a third color, and a hole blocking layer HBL, which are deposited in due order. The third light emitting layer EML3 may emit blue light, but is not limited to this example.

The common layer 137 may commonly be provided for the first subpixel P1, the second subpixel P2, and the third subpixel P3. The common layer 137 may also be provided among the first subpixel P1, the second subpixel P2, and the third subpixel P3. Therefore, if the upper electrode 123 is provided over the reflective electrode 122, the common layer 137 may be provided at the side of the upper electrode 123, which is exposed as the oxide insulating film 150 is not formed thereon. The common layer 137 may be provided at the side of the upper electrode 123, whereby the second electrode 140 and the upper electrode 123 may be prevented from being short-circuited.

The common layer 137 may include, but is not limited to, a deposited structure of an electron transporting layer ETL and an electron injecting layer EIL, which are deposited in due order.

Meanwhile, although FIG. 8 shows that the oxide insulating film 150 is connected with another oxide insulating film 150 among the subpixels P1, P2, and P3, the oxide insulating film 150 is not limited to this example. The oxide insulating film 150 may be formed to be patterned at the side of each of the first electrodes 120 as shown in FIG. 4.

Also, although FIG. 8 shows that the reflective electrode 122 has an area smaller than that of the lower electrode 121, the reflective electrode 122 is not limited to this example. The reflective electrode 122 may have an area the same as or wider than that of the lower electrode 121 in accordance with a product design.

Figure 10:
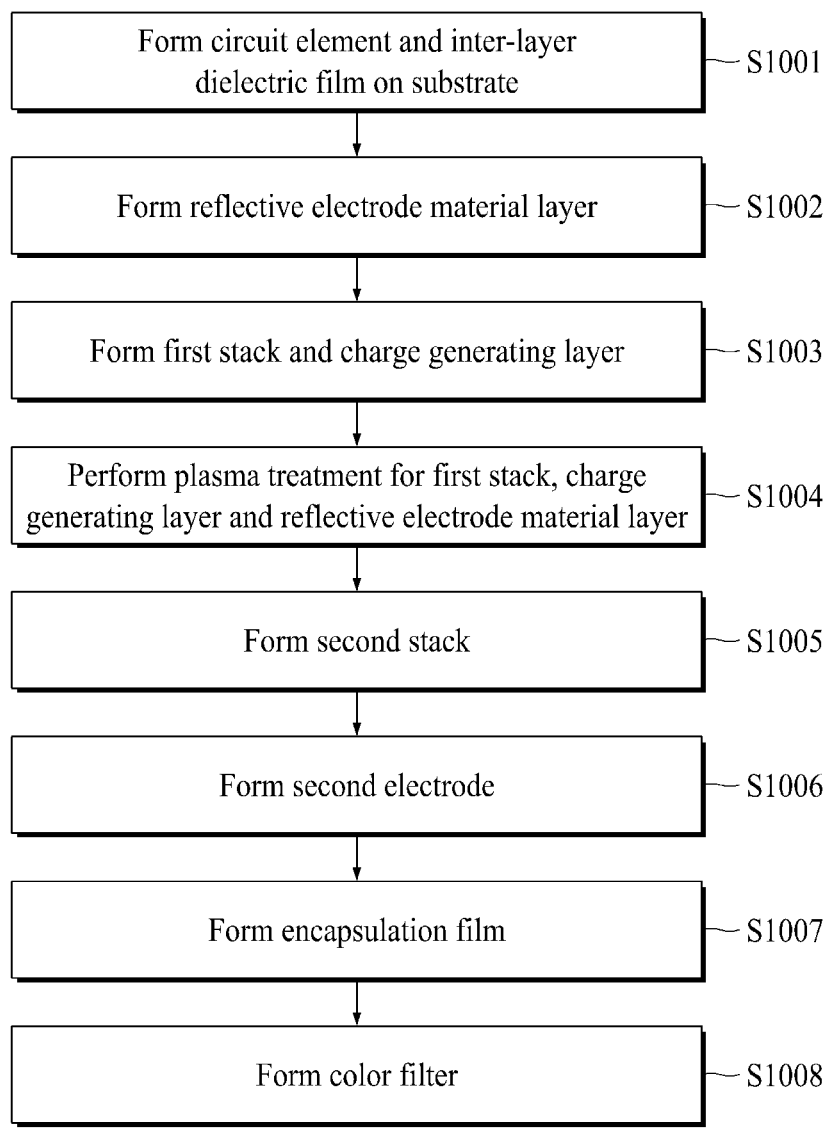
FIG. 10 is a flow chart illustrating a manufacturing method of a display device according to one embodiment of the present disclosure.

FIG. 10 is a flow chart illustrating a manufacturing method of a display device according to one embodiment of the present disclosure, and FIGS. 11A to 11J are cross-sectional views illustrating a manufacturing method of a display device according to one embodiment of the present disclosure.

First of all, the circuit element and the inter-layer dielectric film 115 are formed over the substrate 111 (S1001).

Figure 11A:
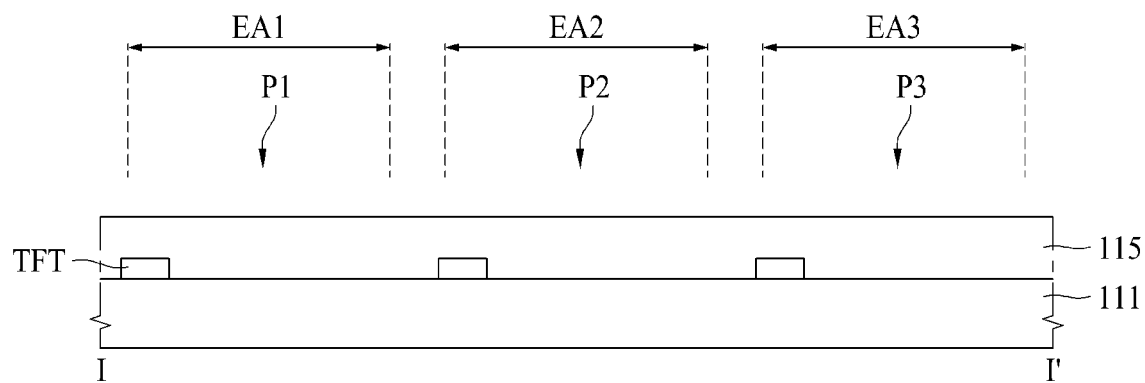
FIGS. 11A to 11J are cross-sectional views illustrating a manufacturing method of a display device according to one embodiment of the present disclosure.

In more detail, as shown in FIG. 11A, the driving thin film transistor TFT is formed over the substrate 111. Then, the inter-layer dielectric film 115 is formed over the driving thin film transistor TFT. The inter-layer dielectric film 115 may be formed of an inorganic layer, and for example, may be formed of SiOx, SiNx, or a multilayer thereof. The inter-layer dielectric film 115 may be formed of an organic layer, and for example, may be formed of an acryl resin, an epoxy resin, a phenolic resin, a polyamide resin, or a polyimide resin. Alternatively, the inter-layer dielectric film 115 may be formed of a multiple layer composed of at least one inorganic layer and at least one organic layer.

Figure 11B:
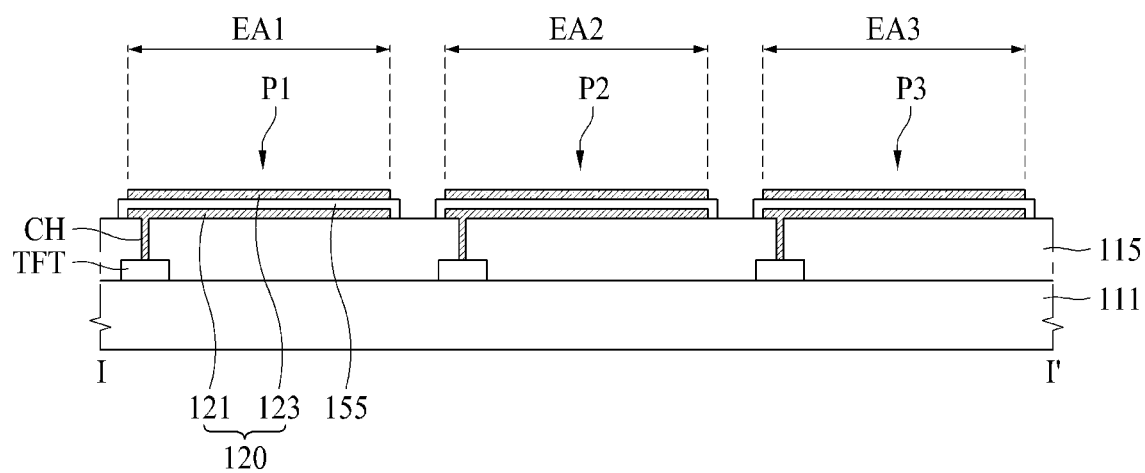

Then, a reflective electrode material layer 155 is formed (S1002). In more detail, as shown in FIG. 11B, the reflective electrode material layer 155 made of a first material is formed over the inter-layer dielectric film 115. At this time, the reflective electrode material layer 155 may be patterned to cover the subpixels P1, P2 and P3 and have an area greater than the subpixels P1, P2 and P3 but is not limited to this example. The reflective electrode material layer 155 may be formed over the entire surface while covering the subpixels P1, P2 and P3. The first material may be a metal material of high reflexibility, such as Al, Ag, and Ag alloy. Ag alloy may be an alloy of Ag, Pd and Cu.

Meanwhile, in one embodiment, as shown in FIG. 11B, before the reflective electrode material layer 155 is formed, the lower electrode 121 may be formed to be patterned for each of the subpixels P1, P2 and P3 but is not limited to this example. If the lower electrode 121 is formed to be patterned for each of the subpixels P1, P2 and P3, the reflective electrode material layer 155 may be formed to have an area wider than that of the lower electrode 121 formed in each of the subpixels P1, P2 and P3. That is, the reflective electrode material layer 155 may be formed to cover the side of the lower electrode 121.

If the lower electrode 121 is formed, the lower electrode 121 may be connected to the source terminal or drain terminal of the driving thin film transistor TFT through the contact hole CH for each of the subpixels P1, P2, and P3. The lower electrode 121 may be formed of a transparent conductive material (TCO) such as ITO and IZO.

Meanwhile, in one embodiment, as shown in FIG. 11B, after the reflective electrode material layer 155 is formed, the upper electrode 123 may be formed to be patterned for each of the subpixels P1, P2, and P3 but is not limited to this example. The upper electrode 123 may be formed to have the same area as that of the reflective electrode material layer 155 but is not limited to this example. The upper electrode 123 may be formed to have the same area as that of the lower electrode 121. In this case, the upper electrode 123 and the lower electrode 121 may be formed to be patterned using the same mask.

If the upper electrode 123 is formed, the upper electrode 123 may be formed of a transparent conductive material (TCO) such as ITO and IZO.

Figure 11C:
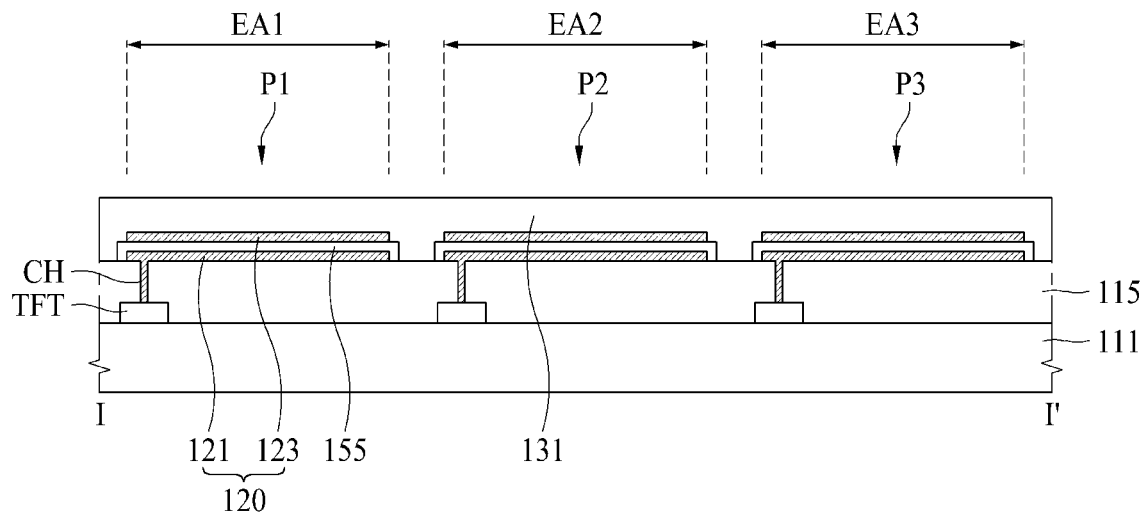

Next, the first stack 131 and the charge generating layer 132 are formed (S1003). In detail, as shown in FIG. 11C, the first stack 131 is formed over the reflective electrode material layer 155. The first stack 131 may be formed by a deposition process or a solution process. If the first stack 131 is formed by a deposition process, the first stack 131 may be formed using an evaporation method.

The first stack 131 may be formed in a deposition structure obtained by sequentially depositing a hole injecting layer (HIL), a hole transporting layer (HTL), a first emitting layer (EML1) configured to emit first colored light, and an electron transporting layer (ETL), but not limited to this structure. The first emitting layer (EML1) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

Figure 11D:
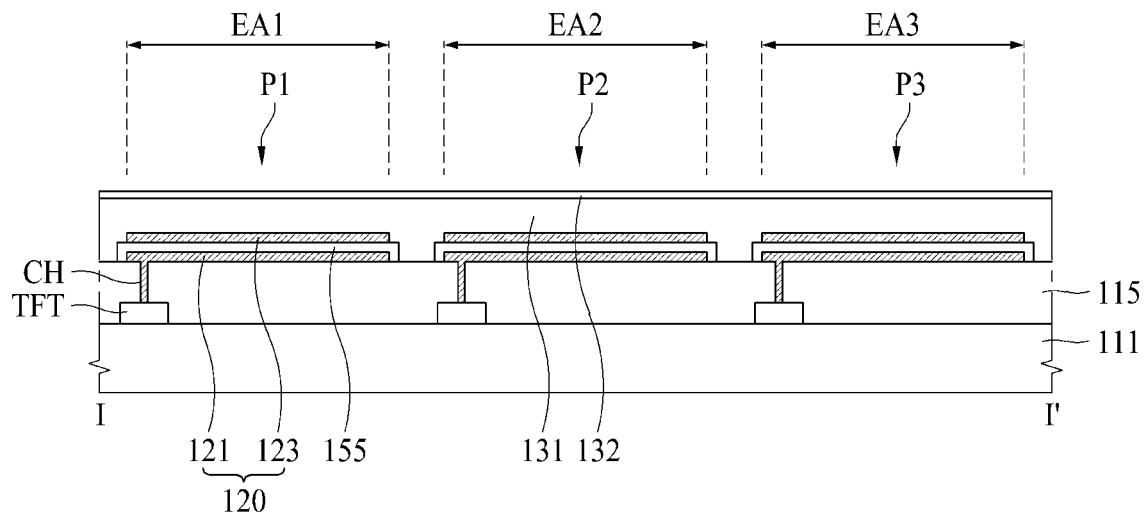

Then, as shown in FIG. 11D, the charge generating layer 132 is formed over the first stack 131. The charge generating layer 132 may be formed of a deposited structure of an N type charge generating layer for supplying electrons to the first stack 131 and a P type charge generating layer for supplying holes to the second stack 133.

Figure 11E:
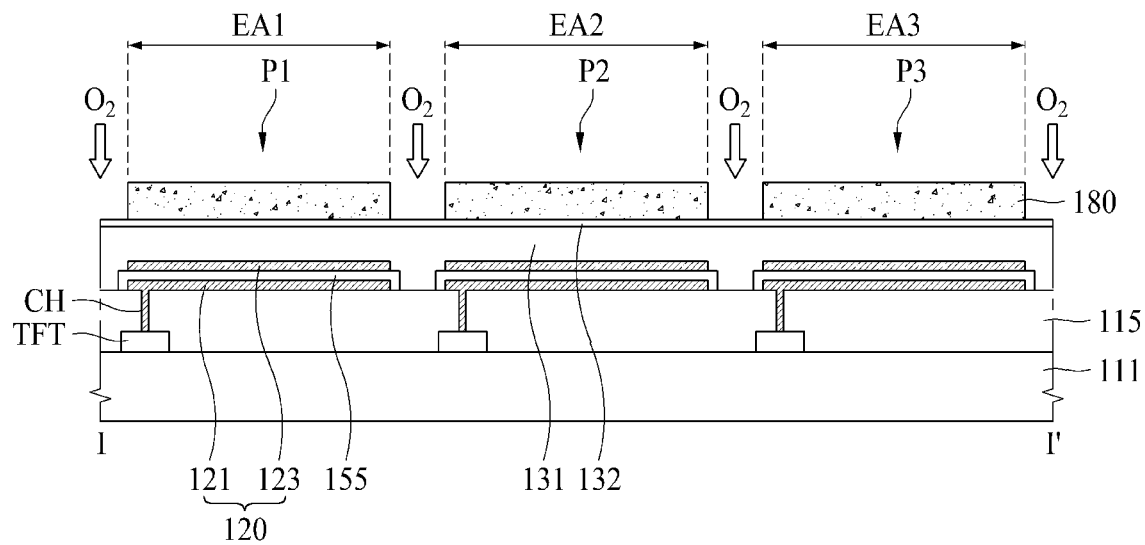

Next, the reflective electrode material layer 155, the first stack 131 and the charge generating layer 132 are subjected to plasma treatment (S1004). In detail, as shown in FIG. 11E, plasma treatment is performed for the reflective electrode material layer 155, the first stack 131 and the charge generating layer 132, which are provided among the subpixels P1, P2 and P3, using $O_2$ gas.

A shield layer 180 is formed to be patterned over the charge generating layer 132. At this time, the shield layer 180 may be formed to be patterned for each of the subpixels P1, P2, and P3 such that the charge generating layer 132 provided among the subpixels P1, P2, and P3 may be exposed. Next, plasma treatment may be performed for the reflective electrode material layer 155, the first stack 131 and the charge generating layer 132, which are provided among the subpixels P1, P2, and P3, using $O_2$ gas. Then, the shield layer 180 may be removed.

Figure 11F:
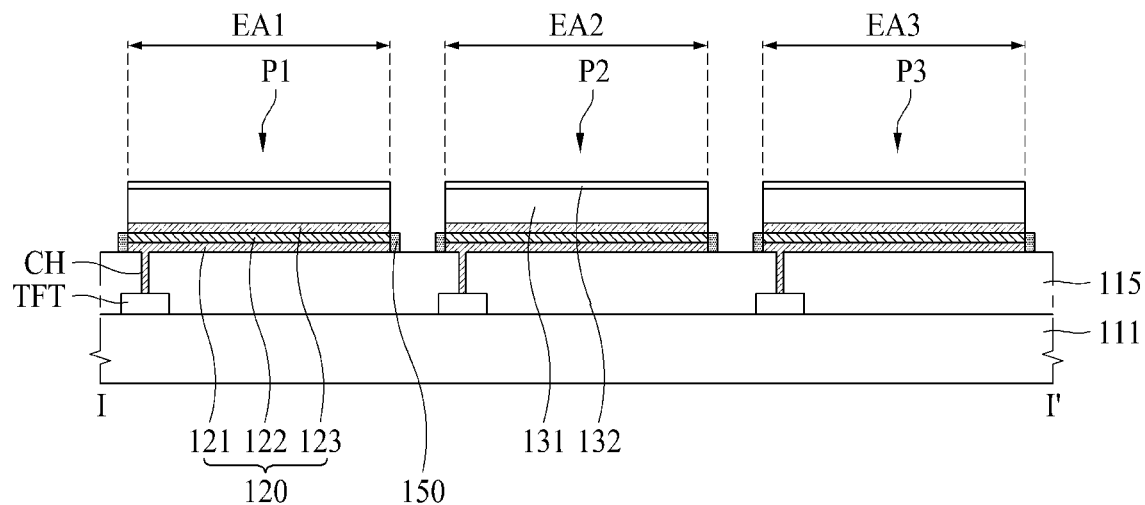

As shown in FIG. 11F, the first stack 131 and the charge generating layer 132, which are provided among the subpixels P1, P2, and P3, are removed by plasma treatment, using $O_2$ gas. Therefore, the first stack 131 and the charge generating layer 132 may be formed to be patterned for each of the subpixels P1, P2, and P3.

The reflective electrode material layer 155 provided among the first to third subpixels P1, P2, and P3 is changed from a first material to a second material by plasma treatment using $O_2$ gas. At this time, the portion of the reflective electrode material layer 155 changed from the first material to the second material may become the oxide insulating film 150, and another portion of the reflective electrode material layer 155 where the first material remains may become the reflective electrode 122. The second material may be an oxide of a reflective metal material, for example, $Al_xO_y$ or $Ag_xO_y$.

If the reflective metal material such as Al and Ag is exposed to $O_2$ gas for a certain time period, the reflective metal material is changed to $Al_xO_y$ or $Ag_xO_y$. At this time, the metal oxide changed by plasma treatment using $O_2$ gas has increased resistance of $1 \times 10^6$ Ω-cm or more and has insulating property. Therefore, the oxide insulating film 150 has an insulating property, and may block the reflective electrodes 122 respectively provided in the first to third subpixels P1, P2, and P3 from being electrically connected.

Figure 11G:
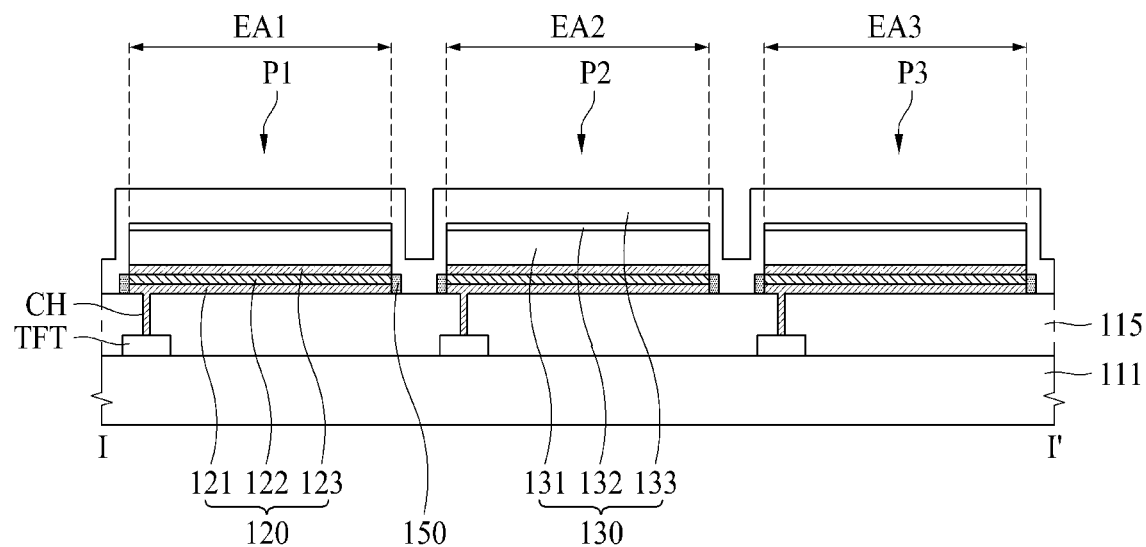

Next, the second stack 133 is formed (S1005). In detail, as shown in FIG. 11G, the second stack 133 is formed over the charge generating layer 132 and the oxide insulating film 150. The second stack 133 may be formed by a deposition process or a solution process. If the second stack 133 is formed by a deposition process, the second stack 133 may be formed using an evaporation method. At this time, the second stack 133 is connected with another second stack 133 among the subpixels P1, P2, and P3.

The second stack 133 may be formed in a deposition structure obtained by sequentially depositing a hole transporting layer (HTL), a second emitting layer (EML2) configured to emit second colored light, an electron transporting layer (ETL), and an electro injecting layer (EIL), but not limited to this structure. The second emitting layer (EML2) may be at least one among a red emitting layer configured to emit red colored light, a green emitting layer configured to emit green colored light, a blue emitting layer configured to emit blue colored light, and a yellow emitting layer configured to emit yellow colored light, but not limited to these types.

The second emitting layer (EML2) may emit light whose color is different from that of the first emitting layer (EML1). For example, the first emitting layer (EML1) may be the blue emitting layer configured to emit the blue colored light, and the second emitting layer (EML2) may be the yellow emitting layer configured to emit the yellow colored light. In another way, the first emitting layer (EML1) may be the blue emitting layer configured to emit the blue colored light, and the second emitting layer (EML2) may be the red emitting layer configured to emit the red colored light, and the green emitting layer configured to emit the green colored light.

Figure 11H:
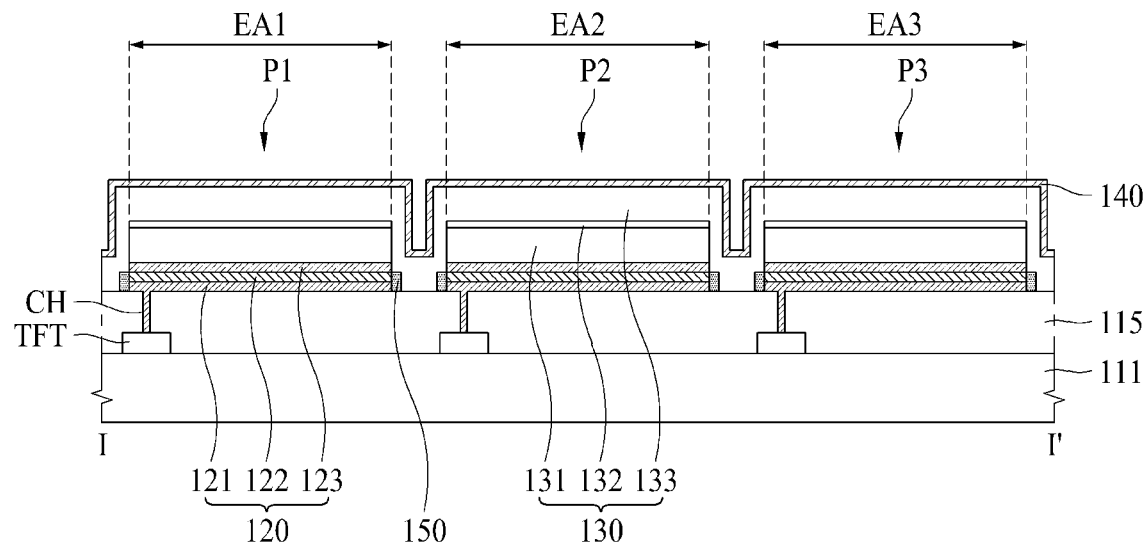

Next, the second electrode 140 is formed (S1006). In more detail, as shown in FIG. 11H, the second electrode 140 is formed over the light emitting layer 130. The second electrode 140 may be formed by a physics vapor deposition method such as sputtering. Alternatively, the second electrode 140 may be formed by an evaporation method.

If the display device is formed in the top emission type, the second electrode 140 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The second electrode 140 may be a cathode electrode.

Figure 11I:
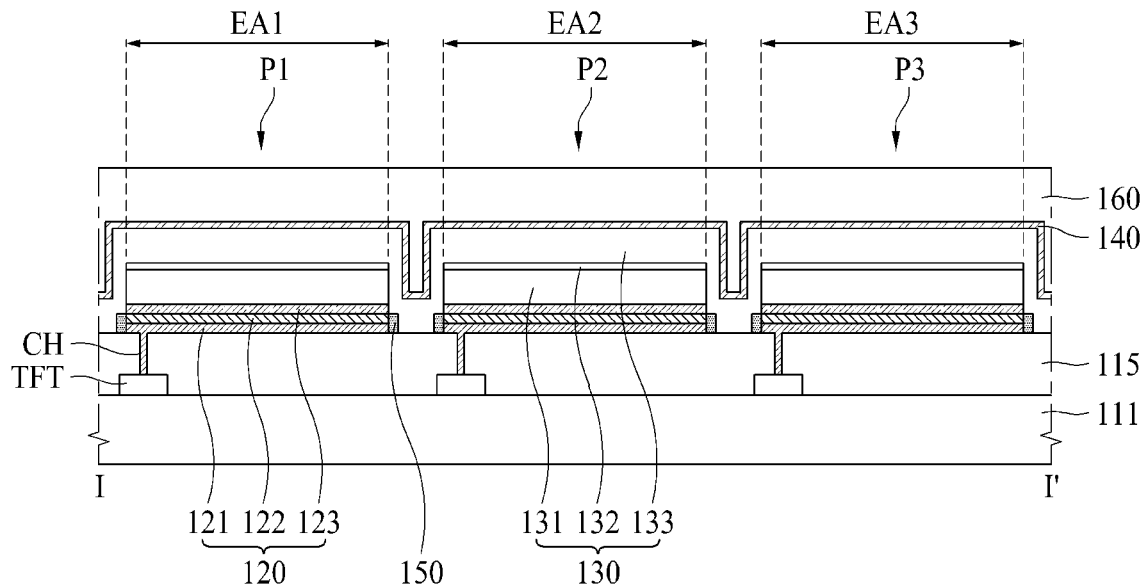

Next, the encapsulation film 160 is formed (S1007). In more detail, as shown in FIG. 11I, the encapsulation film 160 is formed over the second electrode 140. The encapsulation film 160 may include a first inorganic film and an organic film. In one embodiment, the encapsulation film 160 may further include a second inorganic film.

The first inorganic film is formed over the second electrode 140. Then, the organic film is formed over the first inorganic film. It is preferable that the organic film is formed at a sufficient thickness to prevent particles from being permeated into the light emitting layer 130 and the second electrode 140 by passing through the first inorganic film. Then, the second inorganic film is formed over the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be obtained by a vapor deposition method, a printing method, or a slit coating method, but not limited to these methods. The organic film may be obtained by an ink-jet method.

Figure 11J:
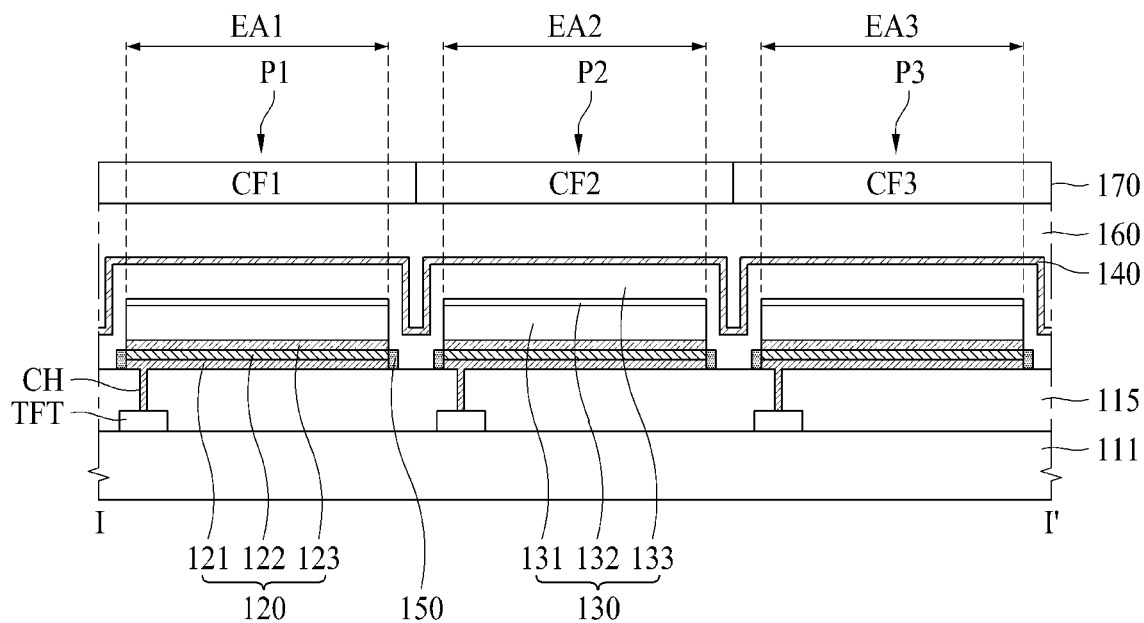

Then, the color filter 170 is formed (S1008). In more detail, as shown in FIG. 11J, the color filter 170 is formed over the encapsulation film 160. The color filter 170 includes a first color filter CF1, a second color filter CF2 and a third color filter CF3, which are arranged to respectively correspond to the subpixels P1, P2, and P3. The first color filter CF1 may be a red color filter transmitting red light, the second color filter CF2 may be a green color filter transmitting green light, and the third color filter CF3 may be a blue color filter transmitting blue light.

Figure 12:
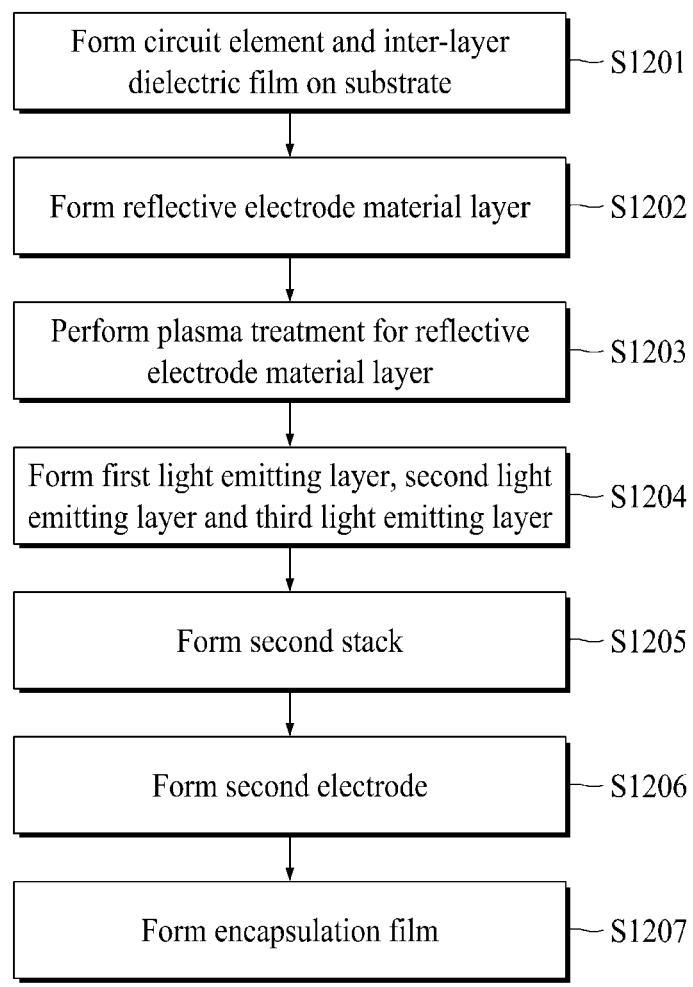
FIG. 12 is a flow chart illustrating a manufacturing method of a display device according to another embodiment of the present disclosure.

FIG. 12 is a flow chart illustrating a manufacturing method of a display device according to another embodiment of the present disclosure, and FIGS. 13A to 13H are cross-sectional views illustrating a manufacturing method of a display device according to another embodiment of the present disclosure.

First of all, the circuit element and the inter-layer dielectric film 115 are formed over the substrate 111 (S1201).

Figure 13A:
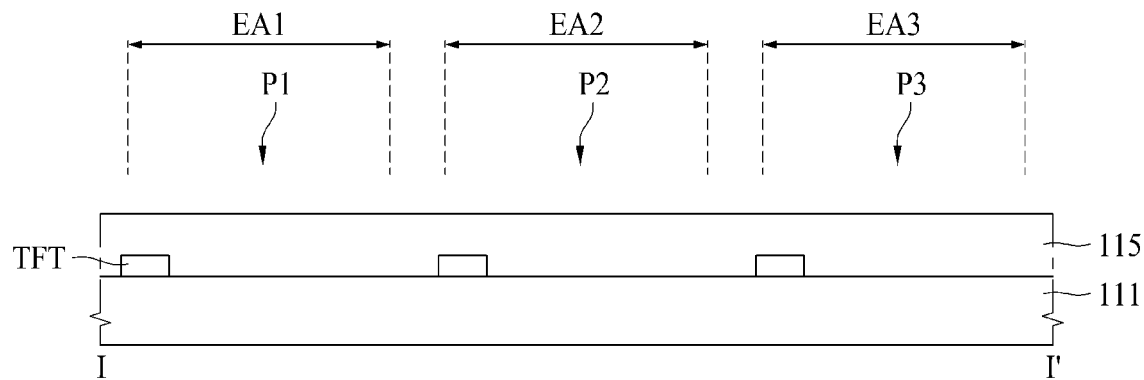
FIGS. 13A to 13H are cross-sectional views illustrating a manufacturing method of a display device according to another embodiment of the present disclosure.

In more detail, as shown in FIG. 13A, the driving thin film transistor TFT is formed over the substrate 111. Then, the inter-layer dielectric film 115 is formed over the driving thin film transistor TFT. The inter-layer dielectric film 115 may be formed of an inorganic layer, and for example, may be formed of SiOx, SiNx, or a multilayer thereof. The inter-layer dielectric film 115 may be formed of an organic layer, and for example, may be formed of an acryl resin, an epoxy resin, a phenolic resin, a polyamide resin, or a polyimide resin. Alternatively, the inter-layer dielectric film 115 may be formed of a multiple layer composed of at least one inorganic layer and at least one organic layer.

Figure 13B:
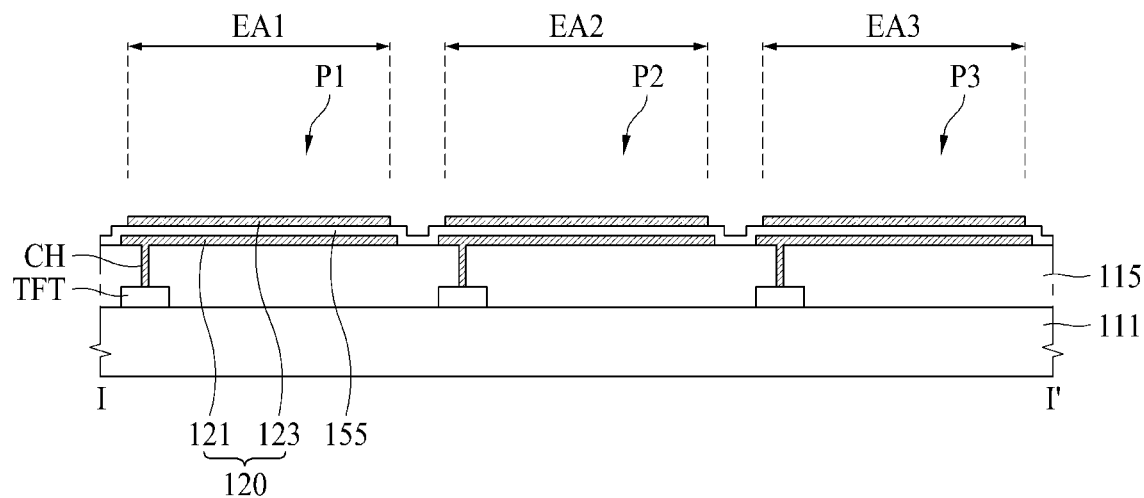

Then, a reflective electrode material layer 155 is formed (S1202). In more detail, as shown in FIG. 13B, the reflective electrode material layer 155 made of a first material is formed over the inter-layer dielectric film 115. At this time, the reflective electrode material layer 155 may be formed over the entire surface while covering the subpixels P1, P2, and P3 but is not limited to this example. The reflective electrode material layer 155 may be patterned to cover the subpixels P1, P2, and P3 and have an area greater than the subpixels P1, P2, and P3. The first material may be a metal material of high reflexibility, such as Al, Ag, and Ag alloy. Ag alloy may be an alloy of Ag, Pd and Cu.

Meanwhile, in one embodiment, as shown in FIG. 13B, before the reflective electrode material layer 155 is formed, the lower electrode 121 may be formed to be patterned for each of the subpixels P1, P2, and P3 but is not limited to this example. If the lower electrode 121 is formed to be patterned for each of the subpixels P1, P2, and P3, the reflective electrode material layer 155 may be formed to have an area wider than that of the lower electrode 121 formed in each of the subpixels P1, P2, and P3. That is, the reflective electrode material layer 155 may be formed to cover the side of the lower electrode 121.

If the lower electrode 121 is formed, the lower electrode 121 may be connected to the source terminal or drain terminal of the driving thin film transistor TFT through the contact hole CH for each of the subpixels P1, P2, and P3. The lower electrode 121 may be formed of a transparent conductive material (TCO) such as ITO and IZO.

Meanwhile, in one embodiment, as shown in FIG. 13B, after the reflective electrode material layer 155 is formed, the upper electrode 123 may be formed to be patterned for each of the subpixels P1, P2, and P3 but is not limited to this example. The upper electrode 123 may be formed to have the same area as that of the reflective electrode material layer 155 but is not limited to this example. The upper electrode 123 may be formed to have the same area as that of the lower electrode 121. In this case, the upper electrode 123 and the lower electrode 121 may be formed to be patterned using the same mask.

If the upper electrode 123 is formed, the upper electrode 123 may be formed of a transparent conductive material (TCO) such as ITO and IZO.

Figure 13C:
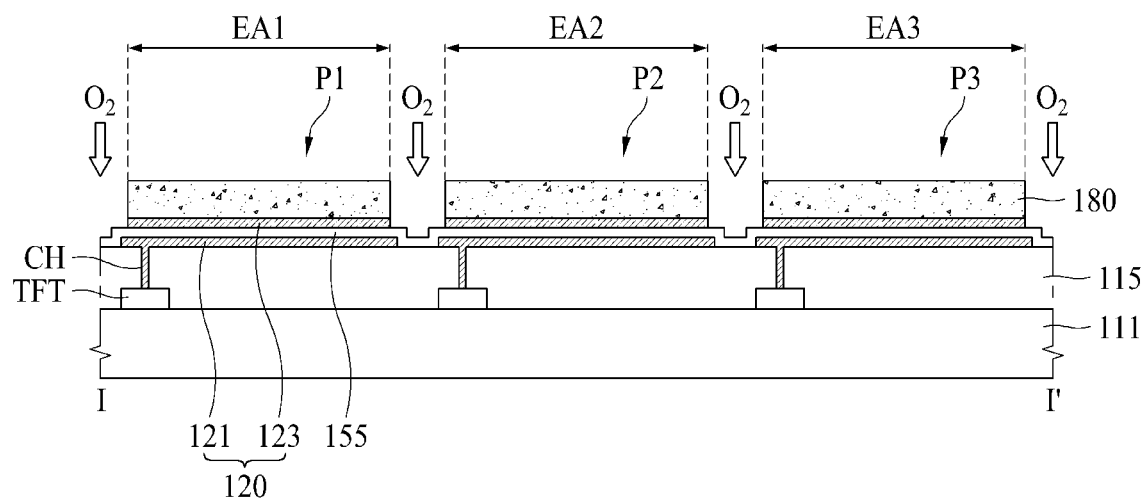

Next, the reflective electrode material layer 155 is subjected to plasma treatment (S1203). In detail, as shown in FIG. 13C, plasma treatment is performed for the reflective electrode material layer 155, which is provided among the subpixels P1, P2 and P3, using $O_2$ gas.

A shield layer 180 is formed to be patterned over the reflective electrode material layer 155. At this time, the shield layer 180 may be formed to be patterned for each of the subpixels P1, P2, and P3 such that the reflective electrode material layer 155 provided among the subpixels P1, P2, and P3 may be exposed. Next, plasma treatment may be performed for the reflective electrode material layer 155, which is provided among the subpixels P1, P2, and P3, using $O_2$ gas. Then, the shield layer 180 may be removed.

Figure 13D:
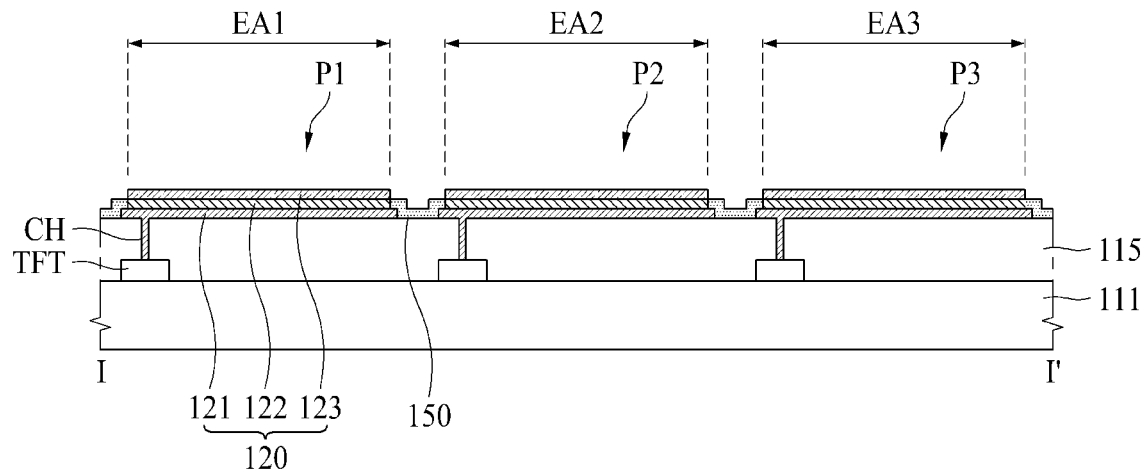

As shown in FIG. 13D, the reflective electrode material layer 155 provided among the subpixels P1, P2, and P3 is changed from a first material to a second material by plasma treatment using $O_2$ gas. At this time, the portion of the reflective electrode material layer 155 changed from the first material to the second material may become the oxide insulating film 150, and another portion of the reflective electrode material layer 155 where the first material remains may become the reflective electrode 122. The second material may be an oxide of a reflective metal material, for example, $Al_xO_y$ or $Ag_xO_y$.

If the reflective metal material such as Al and Ag is exposed to $O_2$ gas for a certain time period, the reflective metal material is changed to $Al_xO_y$ or $Ag_xO_y$. At this time, the metal oxide changed by plasma treatment using $O_2$ gas has increased resistance of $1 \times 10^6$ Ω-cm or more and has insulating property. Therefore, the oxide insulating film 150 has insulating property, and may block the reflective electrodes 122 respectively provided in the first to third subpixels P1, P2, and P3 from being electrically connected.

Meanwhile, in the description of FIGS. 13B, 13C, and 13D, after the upper electrode 123 is formed over the reflective electrode material layer 155, plasma treatment is performed for the reflective electrode material layer 155. However, the present disclosure is not limited to the examples of FIGS. 13B, 13C, and 13D. The upper electrode 123 may be formed after plasma treatment is performed for the reflective electrode material layer 155. In this case, the upper electrode 123 may be formed to be patterned over the reflective electrode 122 to have the same area as that of the reflective electrode 122.

Next, the first light emitting layer 134, the second light emitting layer 135, and the third light emitting layer 136 are formed to be patterned (S1204).

Figure 13E:
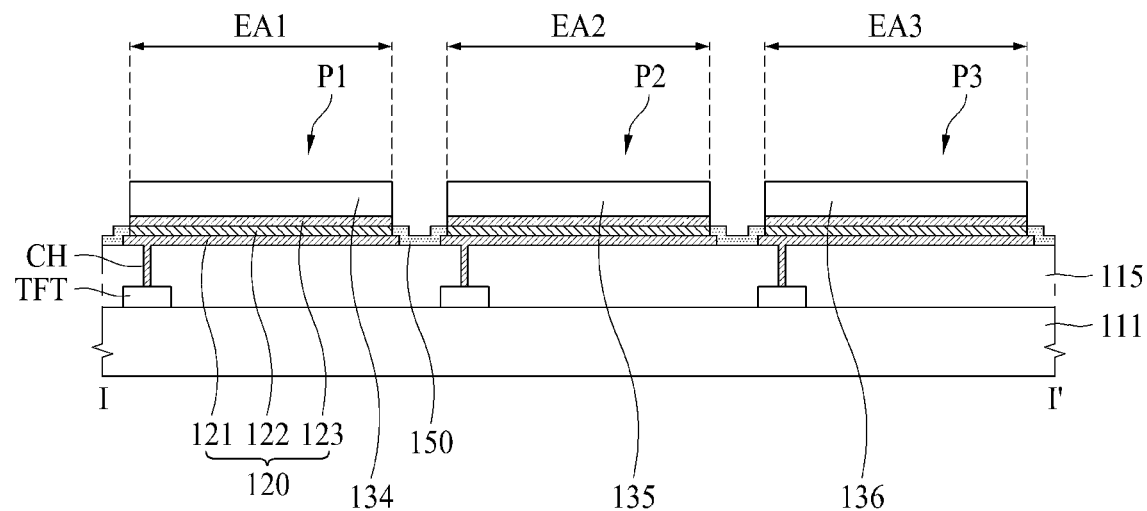

In detail, as shown in FIG. 13E, the first light emitting layer 134, the second light emitting layer 135, and the third light emitting layer 136 are respectively formed to be patterned in the subpixels P1, P2, and P3.

The first light emitting layer 134 is formed to be patterned in the first subpixel P1, and may include, but is not limited to, a deposited structure of a hole injecting layer HIL, a hole transporting layer HTL, a first light emitting layer EML1 emitting light of a first color, and a hole blocking layer HBL, which are deposited in due order. The first light emitting layer EML1 may emit red light, but is not limited to this example.

Then, the second light emitting layer 135 is formed to be patterned in the second subpixel P2, and may include, but is not limited to, a deposited structure of a hole injecting layer HIL, a hole transporting layer HTL, a second light emitting layer EML2 emitting light of a second color, and a hole blocking layer HBL, which are deposited in due order. The second light emitting layer EML2 may emit green light, but is not limited to this example.

Then, the third light emitting layer 136 is formed to be patterned in the third subpixel P3, and may include, but is not limited to, a deposited structure of a hole injecting layer HIL, a hole transporting layer HTL, a third light emitting layer EML3 emitting light of a third color, and a hole blocking layer HBL, which are deposited in due order. The third light emitting layer EML3 may emit blue light, but is not limited to this example.

The first light emitting layer 134, the second light emitting layer 135, and the third light emitting layer 136 may be formed in various sequences.

Figure 13F:
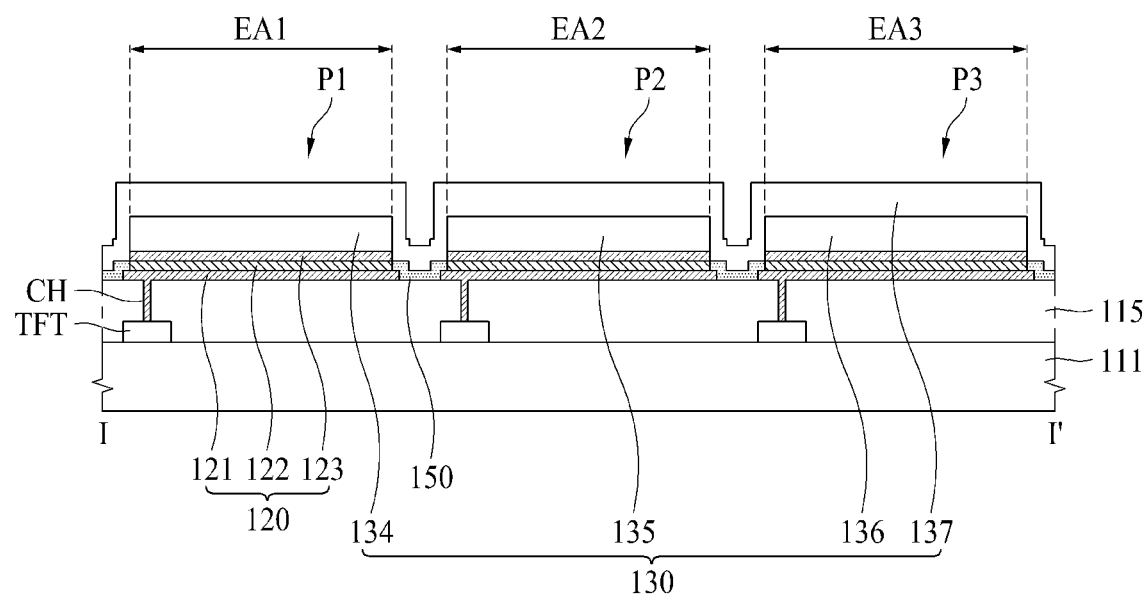

Next, the common layer 137 is formed (S1205). In detail, as shown in FIG. 13F, the common layer 137 is formed over the first light emitting layer 134, the second light emitting layer 135, and the third light emitting layer 136. The common layer 137 may be formed commonly for the first subpixel P1, the second subpixel P2 and the third subpixel P3. The common layer 137 may also be formed among the first subpixel P1, the second subpixel P2 and the third subpixel P3.

The common layer 137 may include, but is not limited to, a deposited structure of an electron transporting layer ETL and an electron injecting layer EIL, which are deposited in due order.

Figure 13G:
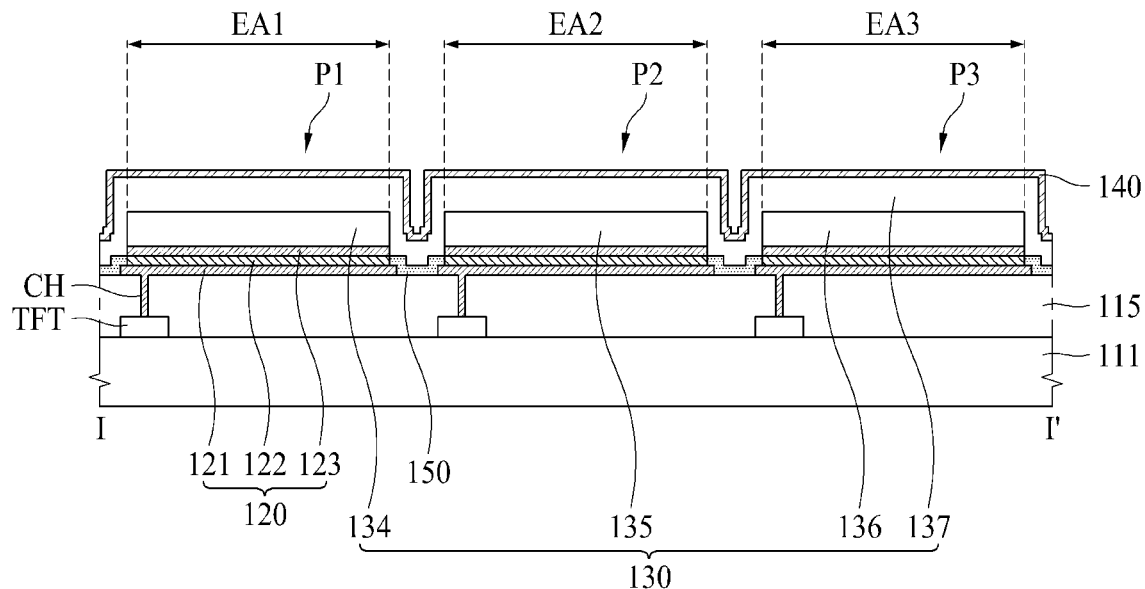

Next, the second electrode 140 is formed (S1206). In more detail, as shown in FIG. 13G, the second electrode 140 is formed over the light emitting layer 130. The second electrode 140 may be formed by a physics vapor deposition method such as sputtering. Alternatively, the second electrode 140 may be formed by an evaporation method.

If the display device is formed in the top emission type, the second electrode 140 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The second electrode 140 may be a cathode electrode.

Figure 13H:
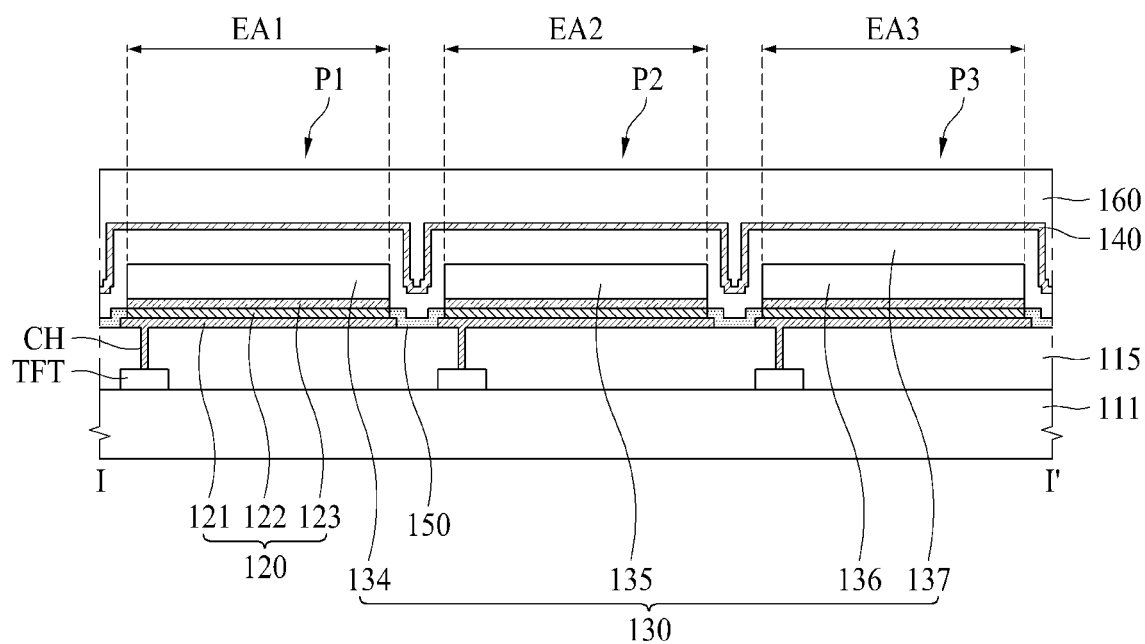

Next, the encapsulation film 160 is formed (S1207). In more detail, as shown in FIG. 13H, the encapsulation film 160 is formed over the second electrode 140. The encapsulation film 160 may include a first inorganic film and an organic film. In one embodiment, the encapsulation film 160 may further include a second inorganic film.

The first inorganic film is formed over the second electrode 140. Then, the organic film is formed over the first inorganic film. It is preferable that the organic film is formed at a sufficient thickness to prevent particles from being permeated into the light emitting layer 130 and the second electrode 140 by passing through the first inorganic film. Then, the second inorganic film is formed over the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be obtained by a vapor deposition method, a printing method, or a slit coating method, but not limited to these methods. The organic film may be obtained by an ink-jet method.

Figure 14A:
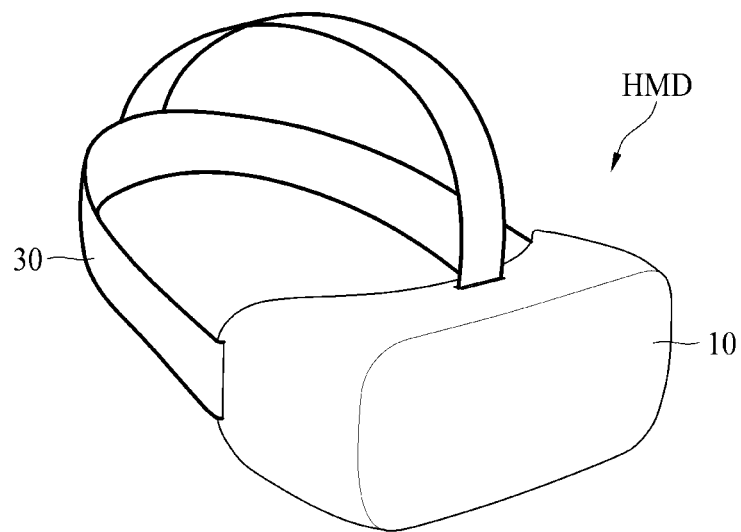
FIGS. 14A to 14C are diagrams illustrating a head-mounted display (HMD) device employing a display device according to another embodiment of the present disclosure.
Figure 14B:
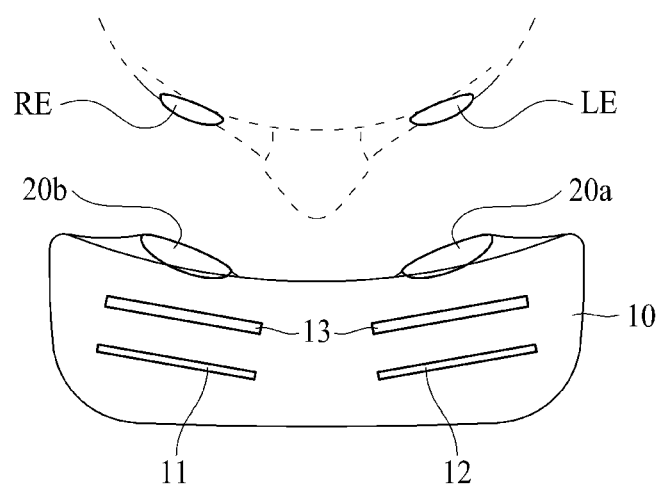
Figure 14C:
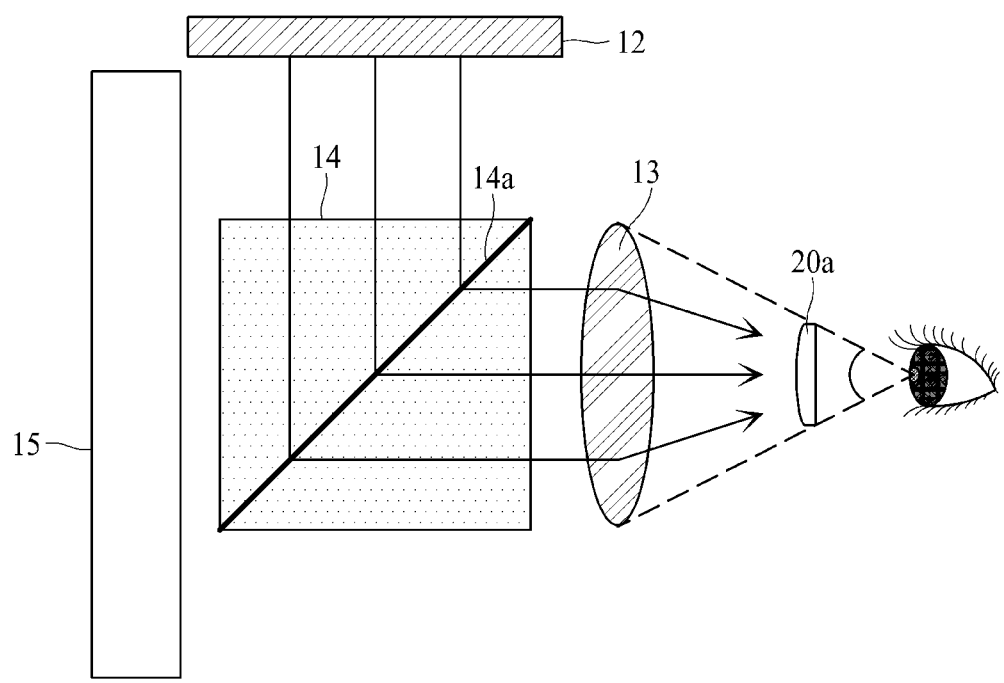

FIGS. 14A to 14C illustrate a display device according to another embodiment of the present disclosure, which relate to a head mounted display (HMD) device. FIG. 14A is a schematic perspective view, FIG. 14B is a schematic plane view of a virtual reality (VR) structure, and FIG. 14C is a cross sectional view of an augmented reality (AR) structure.

As shown in FIG. 14A, the head mounted display (HMD) device according to the present disclosure includes a receiving case 10, and a head mounted band 30.

A display device, a lens array, and an ocular eyepiece may be received in the inside of the receiving case 10.

The head mounted band 30 is fixed to the receiving case 10. In the drawings, the head mounted band 30 is configured to surround an upper surface and both lateral surfaces in a user's head, but not limited to this structure. For example, the head mounted band is provided to fix the head mounted display (HMD) device to a user's head, which may be substituted by an eyeglass-frame shape or a helmet-shaped structure.

As shown in FIG. 14B, the head mounted display (HMD) device of the virtual reality (VR) structure according to the present disclosure includes a left-eye display device 12, a right-eye display device 11, a lens array 13, a left-eye ocular eyepiece 20a, and a right-eye ocular eyepiece 20b.

The left-eye display device 12, the right-eye display device 11, the lens array 13, and the left-eye ocular eyepiece 20a, and the right-eye ocular eyepiece 20b are received in the aforementioned receiving case 10.

The same image may be displayed on the left-eye display device 12 and the right-eye display device 11. In this case, a user can watch a two-dimensional (2D) image. If an image for a left eye is displayed on the left-eye display device 12, and an image for a right eye is displayed on the right-eye display device 11, a user can watch a three-dimensional (3D) image. Each of the left-eye display device 12 and the right-eye display device 11 may be formed of the aforementioned display device shown in FIGS. 1 to 9. In this case, an upper portion corresponding to a surface for displaying an image in FIGS. 1 to 9, for example, the color filter 170 confronts the lens array 13.

The lens array 13 may be disposed between the left-eye ocular eyepiece 20a and the left-eye display device 12 while being apart from each of the left-eye ocular eyepiece 20a and the left-eye display device 12. That is, the lens array 13 may be positioned at the front of the left-eye ocular eyepiece 20a and at the rear of the left-eye display device 12. Also, the lens array 13 may be disposed between the right-eye ocular eyepiece 20b and the right-eye display device 11 while being apart from each of the right-eye ocular eyepiece 20b and the right-eye display device 11. That is, the lens array 13 may be positioned at the front of the right-eye ocular eyepiece 20b and at the rear of the right-eye display device 11.

The lens array 13 may be a micro lens array. The lens array 13 may be substituted by a pin hole array. Owing to the lens array 13, an image displayed on the left-eye display device 12 or the right-eye display device 11 may be expanded and perceived by a user.

A user's left eye (LE) may be positioned at the left-eye ocular eyepiece 20a, and a user's right eye (RE) may be positioned at the right-eye ocular eyepiece 20b.

As shown in FIG. 14C, the head mounted display (HMD) device of the augmented reality (AR) structure according to the present disclosure includes a left-eye display device 12, a lens array 13, a left-eye ocular eyepiece 20a, a transmissive reflecting portion 14, and a transmission window 15. FIG. 14C shows only the left-eye structure, for convenience of explanation. The right-eye structure is identical in structure to the left-eye structure.

The left-eye display device 12, the lens array 13, the left-eye ocular eyepiece 20a, the transmissive reflecting portion 14, and the transmission window 15 are received in the aforementioned receiving case 10.

The left-eye display device 12 may be disposed at one side of the transmissive reflecting portion 14, for example, an upper side of the transmissive reflecting portion 14 without covering the transmission window 15. Accordingly, an image may be provided to the transmissive reflecting portion 14 under the condition that an ambient background seen through the transmission window 15 is not covered by the left-eye display device 12.

The left-eye display device 12 may be formed of the display device shown in FIGS. 1 to 9. In this case, an upper portion corresponding to a surface for displaying an image in FIGS. 1 to 9, for example, the color filter 170 confronts the transmissive reflecting portion 14.

The lens array 13 may be provided between the left-eye ocular eyepiece 20a and the transmissive reflecting portion 14.

A user's left eye is positioned at the left-eye ocular eyepiece 20a.

The transmissive reflecting portion 14 is disposed between the lens array 13 and the transmission window 15. The transmissive reflecting portion 14 may include a reflection surface 14a which partially transmits some of light, and also reflects the remaining light. The reflection surface 14a is configured to guide an image, which is displayed on the left-eye display device 12, toward the lens array 13. Thus, a user can watch an image displayed on the left-eye display device 12 together with the ambient background through the transmission window 15. That is, a user can watch one image obtained by a virtual image overlaid with the ambient real background, to thereby realize an augmented reality (AR).

The transmission window 15 is disposed in front of the transmissive reflecting portion 14.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a substrate provided with a first subpixel and a second subpixel arranged to adjoin the first subpixel;
a first electrode provided in each of the first subpixel and the second subpixel on the substrate, and including a first material;
an oxide insulating film provided on at least a portion of a side of the first electrode, and including a second material; and
a light emitting layer provided on the first electrode, wherein the light emitting layer includes a plurality of layers including a common layer, wherein the common layer is disposed on the first electrode of the first subpixel and the first electrode of the second subpixel, the common layer connected between the first subpixel and the second subpixel,
wherein the first material is a metal material, and the second material is an oxide of the first material,
wherein the oxide insulating film is provided between the first electrode provided in the first subpixel and the first electrode provided in the second subpixel, and
wherein the common layer of the light emitting layer directly contacts the oxide insulating film between the first subpixel and the second subpixel.

2. The display device of claim 1, wherein the first electrode includes a reflective electrode provided in each of the first subpixel and the second subpixel and including the first material, and the oxide insulating film is provided on a side of the reflective electrode.

3. The display device of claim 1, wherein the first material is Al or Ag, and the second material is $Al_xO_y$ or $Ag_xO_y$.

4. The display device of claim 1, wherein the oxide insulating film includes a first oxide insulating film covering at least a portion of the side of the first electrode provided in the first subpixel and a second oxide insulating film covering at least a portion of the side of the first electrode provided in the second subpixel, and the first oxide insulating film and the second oxide insulating film are spaced apart from each other.

5. The display device of claim 1, wherein the oxide insulating film is extended from the side of the first electrode provided in the first subpixel to the side of the first electrode provided in the second subpixel.

6. The display device of claim 1, wherein the first electrode includes another plurality of layers, and at least one of the plurality of layers includes the first material.

7. The display device of claim 6, wherein the first electrode includes:
a lower electrode provided in each of the first subpixel and the second subpixel on the substrate;
a reflective electrode provided on the lower electrode and including the first material; and
an upper electrode provided on the reflective electrode.

8. The display device of claim 7, wherein the oxide insulating film covers at least a portion of a side of the lower electrode and at least a portion of a side of the reflective electrode, and exposes a side of the upper electrode.

9. The display device of claim 6, further comprising:
a second electrode provided on the light emitting layer, and
wherein at least one of the plurality of layers constituting the light emitting layer has a same area as that of a layer including the first material among the plurality of layers constituting the first electrode.

10. The display device of claim 9, wherein the light emitting layer includes:
a first stack provided on the first electrode, emitting light of a first color;
a charge generating layer provided on the first stack; and
a second stack provided on the charge generating layer, emitting light of a second color, and
the charge generating layer provided in the first subpixel and the charge generating layer provided in the second subpixel are spaced apart from each other.

11. The display device of claim 10, wherein the first stack and the charge generating layer have a same area as that of the layer including the first material among the plurality of layers constituting the first electrode.

12. The display device of claim 10, wherein the second stack is connected between the first subpixel and the second subpixel.

* * * * *